(12) United States Patent
Twitchen et al.

(10) Patent No.: US 8,986,646 B2
(45) Date of Patent: Mar. 24, 2015

(54) DIAMOND MATERIAL

(75) Inventors: Daniel James Twitchen, Berkshire (GB); Sarah Louise Geoghegan, Berkshire (GB); Neil Perkins, Berkshire (GB); Rizwan Uddin Ahmad Khan, Berkshire (GB)

(73) Assignee: Element Six Technologies Limited (GB)

( * ) Notice: Subject to any disclaimer, the term of this patent is extended or adjusted under 35 U.S.C. 154(b) by 623 days.

(21) Appl. No.: 12/823,548

(22) Filed: Jun. 25, 2010

(65) Prior Publication Data

US 2010/0329962 A1    Dec. 30, 2010

Related U.S. Application Data

(60) Provisional application No. 61/220,663, filed on Jun. 26, 2009, provisional application No. 61/247,735, filed on Oct. 1, 2009, provisional application No. 61/310,639, filed on Mar. 4, 2010, provisional application No. 61/320,023, filed on Apr. 1, 2010, provisional application No. 61/332,878, filed on May 10, 2010.

(51) Int. Cl.
| | |
|---|---|
| B01J 3/06 | (2006.01) |
| C30B 29/02 | (2006.01) |
| C30B 29/04 | (2006.01) |
| C23C 16/27 | (2006.01) |
| C23C 16/56 | (2006.01) |
| C30B 25/10 | (2006.01) |
| C30B 31/20 | (2006.01) |
| A44C 17/00 | (2006.01) |

(52) U.S. Cl.
CPC ............. *C23C 16/278* (2013.01); *C23C 16/27* (2013.01); *C23C 16/56* (2013.01); *C30B 25/105* (2013.01); *C30B 29/04* (2013.01); *C30B 31/20* (2013.01); *A44C 17/008* (2013.01)
USPC .......................... 423/446; 117/928; 117/929

(58) Field of Classification Search
None
See application file for complete search history.

(56) References Cited

U.S. PATENT DOCUMENTS

| | | | |
|---|---|---|---|
| 2,945,793 | A | 7/1960 | Dugdale |
| 4,959,201 | A | 9/1990 | Satoh et al. |

(Continued)

FOREIGN PATENT DOCUMENTS

| | | |
|---|---|---|
| EP | 0 275 063 A2 | 11/1988 |
| EP | 0 316 856 A1 | 11/1988 |

(Continued)

OTHER PUBLICATIONS

Acosta et al.; Diamonds with a High Density of Nitrogen-Vacancy Centers for Magnetometry Applications; Physical Review B 80, 115202; 2009.*

(Continued)

*Primary Examiner* — Guinever Gregorio
(74) *Attorney, Agent, or Firm* — Bryan Cave LLP

(57) ABSTRACT

A method of introducing NV centers in single crystal CVD diamond material is described. One step of the method comprises irradiating diamond material that contains single substitutional nitrogen to introduce isolated vacancies into the diamond material in a concentration of at least 0.05 ppm and at most 1 ppm. Another step of the method comprises annealing the irradiated diamond to form NV centers from at least some of the single substitutional nitrogen defects and the introduced isolated vacancies.

20 Claims, 8 Drawing Sheets

(56) References Cited

U.S. PATENT DOCUMENTS

| | | | |
|---|---|---|---|
| 5,451,430 | A | 9/1995 | Anthony et al. |
| 5,672,395 | A | 9/1997 | Anthony et al. |
| 6,030,595 | A | 2/2000 | Sumiya et al. |
| 7,122,837 | B2 | 10/2006 | Linares et al. |
| 7,160,671 | B2 | 1/2007 | Ko et al. |
| 7,172,655 | B2 | 2/2007 | Twitchen et al. |
| 7,964,280 | B2 * | 6/2011 | Williams et al. ............... 428/408 |
| 2002/0172638 | A1 | 11/2002 | Vagarali et al. |
| 2004/0175499 | A1 * | 9/2004 | Twitchen et al. .......... 427/249.8 |
| 2004/0194690 | A1 | 10/2004 | Twitchen et al. |
| 2004/0229464 | A1 | 11/2004 | Godfried et al. |
| 2005/0181131 | A1 | 8/2005 | Linares et al. |
| 2006/0292302 | A1 | 12/2006 | Chodelka et al. |
| 2007/0053823 | A1 | 3/2007 | Vins |
| 2007/0092647 | A1 | 4/2007 | Scarsbrook et al. |
| 2008/0241049 | A1 | 10/2008 | Hemley et al. |
| 2010/0028556 | A1 | 2/2010 | Linares et al. |
| 2010/0104494 | A1 | 4/2010 | Meng et al. |

FOREIGN PATENT DOCUMENTS

| | | |
|---|---|---|
| EP | 0 615 954 A1 | 8/1994 |
| EP | 0 671 482 A1 | 3/1995 |
| EP | 1 990 313 A1 | 10/2007 |
| GB | 2 430 194 A | 5/2003 |
| GB | 743584 A | 3/2007 |
| JP | 2 571 797 B2 | 11/1987 |
| JP | 62296875 | 11/1987 |
| JP | 2 184 600 A | 1/1989 |
| JP | 64 020689 | 1/1989 |
| JP | 01 131014 A | 5/1989 |
| JP | 01-138112 A | 5/1989 |
| JP | 2 000 385 | 1/1990 |
| JP | 06 263418 | 9/1994 |
| JP | 2005 512929 A | 5/2005 |
| JP | 2005 538018 A | 12/2005 |
| JP | 2006 507204 A | 3/2006 |
| JP | 2010 526746 A | 8/2010 |
| KR | 10-2008-0089734 A | 10/2008 |
| RU | 2145365 C1 | 2/2000 |
| WO | 99 67171 | 12/1999 |
| WO | 01 96633 A1 | 12/2001 |
| WO | 01 96634 A1 | 12/2001 |
| WO | 03 014427 A1 | 2/2003 |
| WO | 03 052177 A1 | 6/2003 |
| WO | 2004 022821 A1 | 3/2004 |
| WO | 2004 046427 A1 | 3/2004 |
| WO | 2007 009037 A1 | 1/2007 |
| WO | 2010 010344 A1 | 1/2010 |
| WO | 2010 010352 A1 | 1/2010 |

OTHER PUBLICATIONS

De Weerdt et al, "Defects in coloured natural diamonds," Diamond and Related Materials, 10, 2001, pp. 474-479.

G. Davies, "Current problems in diamond: towards a quantitative understanding," Physica B. 273-274, 1999, pp. 15-23.

King, et al., "Color grading of colored diamonds in the GIA gem trade laboratory," Gems & Gemology, vol. 30, No. 4, 1994, pp. 220-242.

P. Von Fritz, "Uber Brechungsindizes und Absorptionskonstanten des Diamanten zwischen 644 und 288 mu1). ," Z. Phys. 15, 1923, pp. 358-368.

Howarth, et al., "Generalization of the lineshape useful in magnetic resonance spectroscopy," J. Magn. Res., 161, 2003, pp. 215-221.

Hyde, et al., "Pseudo Field Modulation in EPR Spectroscopy," Appl. Magn. Reson., 1, 1990, pp. 483-496.

Wyszecki, et al., "Color Science Concepts and Methods, Quantitative Data and Formulas," New York; London-Sydney, 1967, pp. 9, 242-251.

Commission Internationale de L'Eclairage, "Colorimetry," 1986, pp. 27-33.

Pagel-Theisen et al., "Diamond Grading ABC The Manual," Rubin & Son, Belgium, 9th Edition, 2001, pp. 64-67.

Bradlow et al., "Asymmetry of the GR1 line in type IIA diamond," Solid State Communications, vol. 38, 1981, pp. 247-249.

Collins et al., "The annealing of radiation damage in De Beers colourless CVD diamond," Diamond and Related Materials, vol. 3, No. 4-6, 1994, pp. 932-935.

Fritsch, et al., "Thermochromic and photochromic behavior of "chameleon" diamonds," Diamond and Related Materials, vol. 16, 2007, pp. 401-408.

Kennedy, et al., "Long coherence times at 300 K for nitrogen-vacancy center spins in diamond grown by chemical vapor deposition," Applied Physics Letters, vol. 83, No. 20, 2003, pp. 4190-4192.

Nelder, et al., "A simplex method for function minimization," The Computer Journal, 7, 1965, pp. 308-313.

Walderman et al., "Creating diamond color centers for quantum optical applications," Diamond and Related Materials, vol. 16, 2007, pp. 1887-1895.

J. Walker, "Optical absorption and luminescence in diamond," Rep. Prog. Phys 1979, 42, pp. 1605-1659.

Wang, "CVD Grown Pink Diamonds," GIA Laboratories, Apr. 2009, pp. 1-3.

PCT Search Report for PCT/EP2010/059078 dated Sep. 27, 2010.
PCT Search Report for PCT/EP2010/059080 dated Aug. 26, 2010.
PCT Search Report for PCT/EP2010/059081 dated Sep. 22, 2010.
PCT Search Report for PCT/EP2010/059084 dated Sep. 20, 2010.

McLaren, et al., The Derivation of Hue-Difference Terms from CIELAB Coordinates, Color Research and Application, vol. 6(2), pp. 75-77, 1981.

Search Report for GB1005573.9 dated Jul. 29, 2010.
Search Report for GB0911075.0 dated Oct. 29, 2009.
Search Report for GB1003613.5 dated Jun. 30, 2010.

Stesmans et al., "Chemical Vapour Deposition Diamond Studied by Optical and Electron Spin Resonance Techniques," J. Physics; Condes. Matter; vol. 14, 2002, pp. R467-R499.

* cited by examiner

DIAMOND MATERIAL

Embodiments of this invention relate to a method of irradiating and annealing CVD diamond material (that is diamond material made by a CVD—continuous vapor deposition—process), particularly to a method of irradiating and annealing CVD diamond material containing single substitutional nitrogen, $N_s^0$. Some methods according to the present invention comprise irradiating and annealing the diamond material to produce fancy pale pink colored diamonds. Other methods according to the present invention comprise irradiating and annealing the diamond material to produce a diamond material suitable for use in spintronic applications. Other embodiments of the invention provide diamond material per se.

The term "fancy-colored diamond" is a well-established gem trade classification and is used to refer to unusually colored diamonds. A useful history and background to the grading of fancy colored diamond gemstones, including the use of Munsell color charts is given by King et al, in Gems & Gemology, Vol. 30, No. 4, 1994 (pp. 220-242).

Intrinsic diamond material has an indirect band gap of 5.5 eV and is transparent in the visible part of the spectrum. Introducing defects or color centers, as they will be called hereinafter, which have associated energy levels within the band gap gives the diamond a characteristic color that is dependent on the type and concentration of the color centers. This color can result from either absorption or photoluminescence or some combination of these two. Generally absorption is the dominant factor. One example of a common color center present in synthetic diamond material is nitrogen which, when on a substitutional lattice site in the neutral charge state, has an associated energy level 1.7 eV below the conduction band which causes absorption at the blue end of the visible spectrum, which by itself causes the diamond to have a characteristic yellow/brown color. Such a nitrogen atom when on a substitutional lattice site in the neutral charge state is known as a $N_s^0$ defect, the concentration of which is denoted by $[N_s^0]$.

Examples of fancy colored synthetic and natural diamonds made by introducing color centers into the diamond are known in the prior art. For example, EP0615954A and EP0316856A describe irradiation of synthetic diamond material with an electron beam or a neutron beam to form lattice defects (interstitials and vacancies) in the crystal. Thereafter the diamond crystal is annealed in a prescribed temperature range to form color centers. One color center described is a substitutional nitrogen atom adjacent to a vacancy, referred to as an "NV color center", which can give the diamond material a desirable fancy color, such as purple (as described in EP0316856A) or red/pink (as described in EP0615954A). EP0615954A states that it was found necessary to employ an NV center as the color center while reducing its concentration, in order to obtain the red or pink colors. The publication states that absorption by type 1 b nitrogen has the action of coloring the rough diamond serving as the base yellow. In order therefore to obtain a pink rather than a red diamond, Sumitomo propose that the absorption coefficient of type Ib nitrogen at 500 nm should be less than 0.1 cm$^{-1}$. They also suggest that the pink diamond should have an absorption coefficient of an NV center at an absorption peak of 570 nm that is at least 0.005 cm$^{-1}$ and less than 0.3 cm$^{-1}$. The only method for making pink diamond described in the application prepares a synthetic diamond using a very high pressure apparatus on seed crystals at a pressure of 5.5 GPa and a temperature of 1350° C., i.e. HPHT (high pressure-high temperature) synthetic diamond. The prepared synthetic diamond comprises at least $3\times10^{16}$ atoms/cm$^3$ and not more than $8\times10^{17}$ atoms/cm$^3$ of type Ib nitrogen, and not more than $5\times10^{17}$ atoms/cm$^3$ of boron. The prepared diamond is then irradiated and annealed under prescribed conditions. The irradiation forms lattice defects in the crystal, and the subsequent anneal causes nitrogen atoms to bond with the lattice defects to form NV color centers.

Another publication describing the formation of fancy colored diamonds is "Optical Absorption and Luminescence" by John Walker in "Reports on Progress in Physics", Volume 42, 1979. That publication similarly describes the steps of forming lattice defects in crystals by electron beam irradiation, and if necessary annealing to cause the lattice defects to combine with nitrogen atoms contained in the crystals.

US 2004/0175499 (Twitchen et al) describes a method starting with a colored CVD diamond, usually brown, and applying a prescribed heat treatment to produce another and desirable color in the diamond. The prior art reference notes that the relative strengths of the absorption bands in the visible region of the spectrum of brown single crystal CVD diamond can be altered by annealing, with concurrent changes in the Raman spectrum, and that changes in the absorption spectrum are observed at much lower temperatures than are required to alter the color of brown natural diamond. Significant color changes are said to be achieved by annealing at atmospheric pressure in an inert atmosphere at temperatures of 1600° C. or less, and gemstones polished from the as-grown CVD diamond can have desirable colors including orange-brown and pinkish brown.

US 2007/0053823 (Viktos Vins) describes a method for producing red diamond starting from a natural brown diamond initially containing 92 ppm nitrogen (A form) and 258 ppm nitrogen (B form) and then applying a HPHT treatment at 2150° C. and 7 GPa for 10 minutes to decrease the concentration of A and B nitrogen centers and change the color of the diamond to greenish yellow. The treated diamond is then irradiated with electrons to create vacancies and annealed at 1100° C. for 24 hours, thereby forming 1.5 to 2 ppm [NV] color centers, and changing the color to a fancy intense purple red.

Wang reports in http://www.gia.edu/research-resources/news-from-research/index.html—"treated pink CVD 24 Jun. 2009" on characterization of seven intensely colored CVD synthetic diamonds (graded as Fancy Intense to Fancy Vivid pink or purplish pink). These diamonds are not pale colored, and their absorption spectra show strong absorptions from vacancy related defects GR1 and ND1 at 741.1 nm and 393.5 nm respectively.

US 2010/0028556 (Apollo) describes a CVD process in which layers of pink colored diamonds are formed by doping with nitrogen. In certain embodiments one or more pink layers are modified by annealing or by irradiation such as by electrons. Irradiation is said to create vacancies, which can be moved to nitrogen centers by annealing. It is noted that the color of a layer may be altered by changing the number of nitrogen vacancy centers.

The spin state of a particle e.g. a photon, electron, atomic nucleus, atomic defect, etc, with discrete spin states can be manipulated using a number of methods and the spin state can be detected and/or controllably altered, using an energy source or detector. This technology where it is the spin property of the defect or electron which is used is referred to in this specification as spintronics. An electron, photon, atomic nucleus or atomic defect with discrete spin states is analogous to a "bit" in a traditional computer and is termed a "quantum bit" (or "qubit"). However, due to the quantum nature of the spin states, a qubit can exist in not just one of two spin states, but also in a superposition of these spin states. It is this superposition of spin states which would make it possible for qubit based computers to compute certain problems at a much greater speed than is possible for classical computers, and in cryptography applications enable a sender to know for certain if a message has been delivered to a receiver without an eavesdropper also learning of the message's contents.

A large number of materials and structures have been proposed for use as qubit hosts ranging from quantum dot semiconductors to super-cooled ion traps. The alternatives to date suffer the disadvantage of operation only being possible at cryogenic temperatures or having very short transverse relaxation lifetimes (referred to as "T2" herein). In contrast, the negatively charged nitrogen-vacancy ("NV⁻") defect in diamond can have a T2 that is sufficiently long for its use in a range of applications at room temperature (about 300 K). The NV⁻ center in diamond can be used for qubit and other spintronic applications since it has discrete quantized magnetic spin states. The NV⁻ center has been thoroughly characterized using techniques such as electron paramagnetic resonance (EPR), photoluminescence (PL), optical absorption spectroscopy and spectroscopy under uniaxial stress. In diamond the NV center has been identified in both the neutral and negative charge states ("NV⁰" and "NV⁻" respectively). The NV center in its negative charge state (NV⁻) has a zero phonon line ("ZPL") at 637 nm compared with 575 nm for an NV center in the neutral state (NV⁰).

One problem in producing materials suitable for spintronic applications is preventing the qubits from decohering, or at least lengthening the time a system takes to decohere. Decoherence is commonly understood to be the process by which quantum becomes classical; the process by which the determinism of the macroscopic world arises out of the superpositions and entanglements that describe the quantum one. Decoherence times may be quantified and compared using the transverse relaxation time T2. A long T2 time is desirable in applications such as quantum computing as it allows more time for the operation of an array of quantum gates and thus allows more complex quantum computations to be performed. A long T2 is desirable in spintronic applications such as magnetometry as it relates to improved magnetic field sensitivity.

In certain embodiments, especially for spintronic applications, when incorporated into the material, the T2 value for the NV⁻ quantum spin defects is as high as possible. In order to achieve this it is desirable to have a material which contains only NV⁻ spin defects and substantially no others, or at least minimized or reduced other defects.

WO 2007/009037 (Apollo) describes how NV centers in diamond can be created in a controlled manner. In one embodiment a single crystal diamond is formed using a CVD process, and then annealed to remove NV centers. A thin layer of single crystal diamond is then formed with a controlled number of NV centers. The Apollo publication explains that CVD diamond grows under conditions where NV⁻, NV⁰ and $N_s^0$ centers are all stable (where NV⁻ centers have a negative charge, and NV⁰ centers have no charge), and that the ratios of these states can be varied by the growth conditions, the concentration and by heat treatment after growth. The NV⁻ centers are said to be introduced to form qubits for use in electronic circuits.

WO 2010/010352 and WO 2010/010344 describe methods of making CVD diamond material of high isotropic purity and high chemical purity suitable for use in spintronic applications. The diamond material is made initially using very low concentrations of nitrogen in the source gas, and then nitrogen is introduced into the diamond material by a post-growth implantation method, to provide the nitrogen for formation of NV⁻ centers. While this method of introducing NV⁻ centers through implantation may be beneficial for some applications, for others it is desirable to optimize the formation of NV⁻ through conversion of nitrogen already in the material to NV⁻ centers. The invention described herein is tailored towards that goal.

We have discovered that methods comprising irradiating and annealing CVD diamond material comprising single substitutional nitrogen defects results in diamond material with advantageous properties. In particular we have discovered a method which maximizes the production of NV centers, while minimizing other undesirable defects. Material made using this method can be used in spintronic and color related applications, e.g. for fancy pale pink synthetic gemstones or for colored filter applications.

This method is different from the method described in EP615954A for making pink diamonds from HPHT synthetic diamonds described, and also different from the method described in US 2004/0175499 and US 2010/0028556 for making colored diamonds. We have also found that diamond material made by the method of this invention advantageously combine high densities of NV centers while simultaneously having a low density of other defects.

One embodiment of the present invention provides a method comprising:

(i) irradiating single crystal diamond material that has been grown by CVD, contains single substitutional nitrogen ($N_s^0$) and has an absorption spectrum with a total integrated absorption in the visible range from 350 nm to 750 nm such that at least 10% of the integrated absorption is attributable to $N_s^0$, to introduce isolated vacancies V into at least part of the CVD diamond material, the concentration of isolated vacancies in the irradiated diamond material being at least 0.05 ppm and at most 1 ppm; and (ii) annealing the irradiated diamond material to form NV centers from at least some of the single substitutional nitrogen)($N_s^0$) defects and the introduced isolated vacancies.

In some embodiments the annealing is carried out at a temperature of at least 700° C. and at most 900° C. so as to form a treated diamond material that contains NV centers. In some embodiments the annealing is carried out for a period of at least 0.1 hours so as to form a treated diamond material that contains NV centers.

The CVD diamond material prior to the irradiation step is referred to sometimes in this specification as "the provided CVD diamond material". The step of actually growing the CVD diamond material may or may not form part of the method of embodiments of the invention. Providing a CVD diamond material may simply mean, for example, selecting a pre-grown CVD diamond material. The diamond material after the irradiation step (i) is referred to in this specification as the irradiated diamond material. The irradiated diamond material after the annealing step (ii) is referred to in this specification as the treated diamond material, or as the irradiated and annealed diamond material.

It will be appreciated that the irradiation may be applied to only part of a piece of diamond material, or to the whole of the piece of diamond material. For example the penetration of the irradiation may be such that only part of the diamond material is irradiated, or part of the diamond material may be shielded from irradiation. The treated diamond material, being that part of the diamond material that has been both irradiated and annealed may be coterminous with the whole piece of diamond material, or may be only a proportion of it.

The annealing step (ii) of the method shall be referred to in this specification as the "NV-forming" annealing step.

The minimum value of 10% of the integrated absorption that is a attributable to single substitution of nitrogen imposes a maximum value of 90% of the integrated absorption that is a attributable to other defects in the diamond material. It is those other defects that are thought to be responsible for the brown coloration in diamond material grown by CVD processes incorporating nitrogen in the source gas, and hence the maximum value of 90% of the integrated absorption that is attributable to those other defects limits the brownness of the CVD diamond material.

As noted above, EP615954A describes production of pink diamonds starting from HPHT synthetic diamonds. The absorption that is minimized in the EP0615954A application is that due to high concentrations of $N_s^0$ which is reduced in order to produce an attractive pink color. The issue is different for CVD diamond material. For CVD diamond material the issue to be addressed is how much $N_s^0$ is advantageously to be incorporated in to the diamond material and how that can be done, rather than how to reduce the $[N_s^0]$ concentration to low enough levels.

Unlike the HPHT diamond material described in EP0615954A, there are unique features in CVD diamond that has been grown in the presence of nitrogen that usually result in a brown color being present. These are described in detail later in this specification. Briefly there is a yellow/brown coloration, which has been mentioned earlier, due to the $N_s^0$ defects themselves, and further brown coloration due to other defects in the diamond material that arise during the CVD growth process as a result of the presence of the $N_s^0$ defects. As color is a combination of the color of the starting material and the color introduced from defects formed by post growth treatments, it is desirable for some embodiments of our invention to reduce the brownness in the CVD diamond whilst maintaining sufficient $N_s^0$ that NV centers can be created on irradiation and annealing so as to achieve the desired final pink color. For other embodiments it is desirable to maintain sufficient $N_s^0$ in the diamond material so that a sufficient proportion of NV centers relative to unconverted $N_s^0$ defects result in the irradiated and annealed sample, in order to provide advantageous spintronic properties.

Using CVD synthetic diamond material rather than HPHT synthetic diamond material provides not only an alternative means of producing attractive pink diamond material to that described in EP0615954A, but may also be advantageous for a number of reasons. Diamond material produced using HPHT synthesis techniques exhibits strongly differential uptake of nitrogen impurity on the surfaces with different crystallographic orientation (which are the surfaces corresponding to differing growth sectors) that form during synthesis. The diamond material therefore tends to show zones with different colors, resulting from the differing nitrogen impurity concentrations in different growth sectors. In addition, it is hard to control the HPHT diamond material synthesis process sufficiently to give a uniform and desired nitrogen concentration throughout even a single growth sector within the synthesized diamond material. Furthermore, in HPHT diamond material synthesis, it is typical to see impurities resulting from the synthesis process and the catalysts used—examples would be inclusions comprising cobalt or nickel—features that can result in localized and inhomogeneous strain that degrade the mechanical, optical (e.g. clarity grade in a gemstone) and thermal properties. In contrast, CVD diamond material is much more uniform in its properties and will not have any issues with metallic inclusions.

A synthetic CVD diamond material may be unequivocally distinguished from a synthetic diamond material synthesized using HPHT techniques by the dislocation structure. In synthetic CVD diamond, dislocations generally thread in a direction that is roughly perpendicular to the initial growth surface of the substrate, i.e. where the substrate is a (001) substrate, the dislocations are approximately aligned parallel to the [001] direction. In synthetic diamond material synthesized using HPHT techniques dislocations that nucleate on surface of the seed crystal (often a surface close to {001}) typically grow in <110> directions. Thus the two types of material can be distinguished by their different dislocation structures observed, for example, in an X-ray topograph.

Another method by which a synthetic CVD diamond material may be positively distinguished from a synthetic diamond material synthesized using HPHT techniques is by detecting the presence of metallic inclusions, such inclusions being incorporated into HPHT-synthesized material as a result of the synthesis process, the metallic inclusions originating from metals used as the solvent catalyst metal, e.g. iron, cobalt, or nickel etc. These inclusions can vary in size, typically from less than 1 μm to more than 100 μm. Larger inclusions within that size range may be observed using a stereo-microscope (e.g. a Zeiss DV4); whilst smaller inclusions within that size range may be observed using transmitted pale in a metallurgical microscope (e.g. a Zeiss "Axiophot").

A further method that can be used to provide positive distinction between synthetic diamonds produced by CVD and HPHT methods is photoluminescence spectroscopy (PL). In the case of HPHT-synthesized material, defects containing atoms from the catalyst metals (typically transition metals) used in the synthesis process (e.g. nickel, cobalt, or iron etc.) are frequently present and the detection of such defects by PL positively indicates that the material has been synthesized by an HPHT method.

The absence of defects related to the presence of catalyst metal atoms in the diamond material of the CVD diamond material in the method of the present invention is an advantage compared with diamond material produced by HPHT methods as such metallic defects can affect the optical properties and local strain around the NV defects leading to altered optical and/or altered spintronic properties.

When considering the influence of the irradiation and annealing step of the method of the present invention on the color of the treated diamond material, it is relevant to discuss the background to what is known about the CVD diamonds and their color.

It is known that the presence of the low concentrations of nitrogen in a CVD growth environment can affect the nature and concentration of the defects that are incorporated in a CVD synthetic diamond material as the diamond material grows, and that at least some of these defects provide color centers which contribute to the color of brown CVD diamond. It is also known that these color centers that contribute to the brown coloration of CVD diamond grown in the presence of low concentrations of nitrogen are unique to single crystal CVD diamond, or to pieces cut or produced from layers of single crystal CVD diamond. It is furthermore known that the color centers contributing to brown coloration in CVD diamond are different from those contributing to any brown coloration observed in natural diamond because the defects in the CVD diamond material cause absorption bands in the absorption spectra of the grown CVD diamond material that are not found in the absorption spectra of natural diamond. Evidence for this comes from Raman scattering from non-diamond carbon observable with an infrared excitation source (e.g. 785 nm or 1064 nm) which is not observed for brown natural diamond. Further, it is known that these color centers in natural diamond material anneal at a different temperature to those in CVD diamond material.

It is believed that some of the color centers contributing to the brown coloration seen in CVD synthetic diamond grown in processes in which low concentrations of nitrogen are introduced relate to localized disruption of the diamond bonding within the single crystal CVD diamond. The exact nature of the defects is not fully understood, but the use of electron paramagnetic resonance (EPR) and optical absorption spectroscopy techniques have been used to study the nature of the defects and improve our understanding somewhat. The presence of the nitrogen in the grown CVD synthetic diamond material can be evidenced by looking at absorption spectra for the grown CVD diamond material, and analysis of these spectra gives some indication of the relative proportions of different types of defect present. A typical spectrum for grown CVD synthetic diamond material grown with nitrogen added to the synthesis environment shows a peak at about 270 nm, which is generated by the presence of neutral single substitutional nitrogen) ($N_s^0$) atoms in the diamond lattice. Additionally peaks have been observed at about 350 nm and approximately 510 nm corresponding to other defects characteristic and unique to CVD synthetic diamond material, and furthermore a so-called "ramp", that is a rising background of the form $c \times \lambda^{-3}$ has been observed, where c is a constant and $\lambda$ is the wavelength. While the $N_s^0$ is primarily identifiable by its peak at 270 nm, it also contributes in smaller amounts to the absorption spectrum at higher wavelengths, in particular at wavelengths in the visible part of the spectrum, which is generally considered to cover the wavelength range 350 nm to 750 nm.

The contribution by the $N_s^0$ defect in the visible part of the absorption spectrum affects the color of any diamond material that the defects are present in, and is believed to be responsible for the yellow coloration of HPHT synthesized type Ib diamond material, which typically comprises 100-250 ppm $N_s^0$.

It is the combination of features evident in the visible part of the absorption spectrum of the CVD diamond material, i.e. (a) the $N_s^0$ contribution in the visible part of the spectrum, (b) the 350 nm peak, (c) the 510 nm peak and (d) the ramp feature, that affect the perceived color of the diamond material and are believed to be responsible for the brown color typically seen in nitrogen doped CVD synthetic diamond material. The peaks at 350 nm and at 510 nm are not seen in the absorption spectra of natural diamonds, nor in the absorption spectra of other synthetic diamonds, for example synthetic HPHT diamonds of the type described in EP615954A. For the purposes of this specification, all defects other than the $N_s^0$ defects that contribute to the absorption spectrum in the visible part of the spectrum, which we have discussed above as the 350 nm, 510 nm and ramp features, will be referred to collectively as "X defects". As noted above, at this time the structural nature of these defects at an atomic level is not understood, merely their effect on the grown diamond material's absorption spectra. Without binding the invention in any way, it is thought that the nature of the defects responsible for the brown coloration might be related to the presence of multi-vacancy clusters (each cluster being made up of tens of vacancies e.g. 30 or 40 vacancies or more) that are grown-in under large growth rates, concomitant with the addition of nitrogen to the plasma to a hydrogen/methane ($H_2$/$CH_4$) source gas. Such clusters are thermally unstable and may be removed to some degree, by high-temperature treatment (i.e. annealing). It is thought that smaller vacancy-related defects, such as a NVH (nitrogen-vacancy-hydrogen) defects that are made up of nitrogen and hydrogen and a missing carbon atom, may be partially responsible for the brown color and these defects may also be removed by high-temperature treatment.

In practice it has been found that the precise width and position in the spectrum of the characteristic absorption bands for the different defects in the CVD diamond material can vary. The position of peak maxima is most easily ascertained by using the second differential of the spectrum. It has been found that absorption spectra can generally be deconstructed into a number of approximate components, and it is useful to carry out this deconstruction, since when the well understood components are subtracted from any recorded spectrum, the contribution of other, less well understood, components can more easily be seen. For example, it is known to subtract the spectral component of standard synthetic diamond material from any observed spectrum. In the present case, for diamond material referred to in the present invention, we have used the spectral decomposition set out in the numbered paragraphs below and shown in FIG. 1 (which is a spectral decomposition of the UV/visible absorption spectrum for a brown CVD synthetic diamond material).

1) Single substitutional nitrogen component with an absorption coefficient at 270 nm.
2) An absorption band centered at 3.54 eV (350 nm)±0.2 eV with a full width at half maximum (FWHM) of approximately 1 eV.
3) An absorption band centered at 2.43 eV (510 nm)±0.4 eV with a FWHM of approximately 1 eV.
4) A small residual wavelength dependent component of the measured absorption coefficient (in $cm^{-1}$) that is found to have a wavelength dependence of the following approximate form: $c \times (wavelength, \lambda, in \mu m)^{-3}$ (ramp factor).

FIG. 1 shows the absorption spectrum of a typical CVD synthetic diamond layer (curve B) which has been removed from its growth substrate, and the components into which it can be deconvoluted. The first step in the spectral decomposition is the subtraction of the spectrum of a type Ib high pressure high temperature (HPHT) synthetic diamond material (curve A), scaled so that the residual shows no 270 nm feature. This subtraction is made since HPHT diamond is generally understood to have an absorption spectrum corresponding to substantially pure type Ib diamond with no impurity or defects other than single substitutional nitrogen ($N_s^0$) contributing to the room temperature spectrum. Therefore its subtraction from the grown CVD overall spectrum allows the contributions due to the presence of other defects (the X defects) introduced into the diamond in the CVD process to be more distinguishable. The residual spectrum is then be deconvoluted into a $c \times \lambda^{-3}$ component (curve C) and two overlapping bands, one centered at 350 nm and the other centered at 510 nm of the kind described above in numbered paragraphs (2) and (3) above. The two overlapping bands are shown as curve D in FIG. 1.

It is known that the form of UV/visible optical absorption spectra of CVD synthetic diamond material grown using a range of different processes can be specified by sums of the components described above, with different weighting factors for the components in different cases.

The color of a diamond colored by using a post growth color center formation methods is the color of the rough diamond prior to post growth treatment combined with the effect on color of the one or more color centers modified or produced during the post growth treatment. In order to obtain the ornamental value desired, and thus achieve a combination of high transparency and desirable color it has been usual practice, for example as described in application EP 0615954 A1, to use diamonds that are initially either colorless or pale yellow. The method described in EP 0615954 is therefore not readily applicable to brown single crystal CVD diamond.

The CVD single crystal diamond material that is irradiated has been grown by CVD and comprises single substitutional nitrogen ($N_s^0$) and has an absorption spectrum with a total integrated absorption in the visible range from 350 nm to 750 nm such that at least 10% of the integrated absorption is attributable to $N_s^0$;

Also, as noted above, this minimum value of 10% of the integrated absorption that is a attributable to single substitution of nitrogen imposes a maximum value of 90% of the integrated absorption that is a attributable to other defects in the diamond material and hence limits the brownness of the CVD diamond material.

For all samples used in this specification, integrated absorption values and absorption peak heights quoted in this specification are measured using a UV/visible absorption spectrum of the synthetic CVD diamond material taken at room temperature.

All room temperature absorption spectra mentioned herein were collected using a Perkin Elmer Lambda-19 spectrometer. The data recorded in the spectra ("the measured spectrum") were processed in the following way to give information on the proportion of the measured absorption in the range 350 to 750 nm that could be attributed to $N_s^0$ and the proportion of that measured absorption that can be attributed to other defects.

a. A reflection loss spectrum was created using tabulated refractive index data and standard expressions for the reflection loss for a parallel-sided plate. The refractive index was determined according to Peter's equation [Z. Phys., 15 (1923), 358-368)] and subsequent reflection loss derived using the standard Fresnel equation.

b. The reflection loss spectrum was subtracted from the measured absorbance data and an absorption coefficient spectrum for the sample is created from the resulting spectrum.

c. In order to determine the component of the measured spectrum that was attributable to $N_s^0$, an absorption spectrum for type Ib HPHT synthetic diamond (for which the absorption is attributed solely to $N_s^0$) was scaled until it is substantially removed the 270 nm peak from the measured spectrum when subtracted from it. This scaling allows the concentration of nitrogen to be determined.

d. Using the visible region of the spectrum as stretching from 350 nm (i.e. 3.2618 eV) to 750 nm (i.e. 1.6527 eV), the integrated absorption in the visible region was determined for the measured sample spectrum and for the component of it attributable to $N_s^0$, and the percentage of the integrated absorption that is attributable to $N_s^0$ defects calculated.

e. In practice reflection losses are generally greater than the theoretical values and this makes it difficult without resorting to wavelength specific calorimetry methods to determine absolute absorption coefficient values. In order to correct for additional losses not directly related to absorption the following routine was used. Towards lower energies it was generally the case that below a particular energy the measured absorption no longer showed significant variation with energy. Absorption coefficient data were shifted so that absorption coefficient was zero at 800 nm.

The CVD diamond material that is irradiated (the provided CVD diamond material) according to the present invention has a total integrated absorption in the range from 350 nm to 750 nm such that at least 10%, or at least 12%, or at least 14%, or at least 16%, or at least 18%, of the integrated absorption (in eV·cm$^{-1}$) is attributable to $N_s^0$. For certain embodiments of method according to the present invention, for the provided CVD diamond material, the percentage of the total integrated absorption that is attributable to $N_s^0$ in the visible range of the absorption spectrum, is as high as possible, for example at least 20%, or at least 30%, or at least 40%, or at least 50%.

For some embodiments the provided CVD diamond has the following characteristic in its room temperature absorption spectrum (absorption coefficient data is shifted so that absorption coefficient is zero at 800 nm):

TABLE 1

| Designation | Starts (nm) | Ends (nm) | Peak (nm) | Absorption coefficient at peak (cm$^{-1}$) |
|---|---|---|---|---|
| 270 nm $N_s^0$ | 220 | 325 | 270 | <4 |

In addition to peak absorption coefficients measured at room temperature after scaling the spectrum according to the methodology above may have the following characteristics set out in Table 2 in its absorption spectrum:

TABLE 2

| Designation | Starts (nm) | Ends (nm) | Peak (nm) | Absorption coefficient at peak (cm$^{-1}$) |
|---|---|---|---|---|
| 350 nm band Part of "X" | 270 | 450 | 350 | <0.7 |
| 510 nm band Part of "X" | 420 | 640 | 510 | <0.3 |

The absorption characteristics set out in Tables 1 and 2, particularly the absorption coefficient at 270 nm are, as described previously, a measure of [$N_s^0$], the starting concentration of $N_s^0$ defects, and are particularly advantageous for methods according to the invention which result in a treated diamond material that is fancy pale pink in color.

For any given provided CVD diamond material, the irradiation introduces isolated vacancies and the annealing process converts at least some of these to NV centers, and it is the NV centers that are responsible for the desirable color, and/or spin properties in the treated diamond, which are an advantageous result of the method of the present invention. The so-called "target [$N_s^0$] concentration" desired to achieve any given desired resultant [NV] concentration can thus be determined working backwards from the desired [NV] concentration. Once the target [$N_s^0$] concentration is known, in repeat production of the provided CVD diamond material, the concentration of [$N_s^0$] may be controlled to within 50%, or 20% of the target [$N_s^0$] concentration. Control of the target [$N_s^0$] concentration is particularly advantageous in methods according to the invention that result in a treated diamond with a fancy pale pink color.

The concentration of [$N_s^0$] present in the synthetic CVD diamond material of the present invention may be measured using EPR for levels $<5 \times 10^{15}$ cm$^{-3}$ and using UV visible optical absorption techniques for higher concentrations.

[$N_s^0$] in the neutral charge state content can be measured by using electron paramagnetic resonance (EPR). Whilst the method is well-known in the art, for completeness it is summarized here. In measurements conducted using EPR, the abundance of a particular paramagnetic defect (e.g. the neutral single-substitutional nitrogen defect) is proportional to the integrated intensity of all the EPR absorption resonance lines originating from that center. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimize the errors associated with double integration, base line correction, finite limits of integration, etc., especially in cases where overlapping EPR spectra are present, a spectral fitting method (using a Nelder-Mead simplex algorithm U. A. Nelder and R. Mead, The Computer Journal, 7 (1965), 308)) is employed to determine the integrated intensity of the EPR centers present in the sample of interest. This entails fitting the experimental spectra with simulated spectra of the defects present in the sample and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsallis line shape in order to produce a good fit to the recorded EPR spectra (J. S. Hyde, M. Pasenkiewicz-Gierula, A. Jesmanowicz, W. E. Antholine, Appl. Magn. Reson., 1 (1990), 483). Using this method the concentration in ppm can be determined with a reproducibility of better than ±5%.

It should be noted that the minimum [NV] concentration in the treated diamond material that can be used for spintronic applications is lower than the minimum [NV] concentration in the treated diamond material that can be used for fancy pale pink colored diamonds. The treated diamond material for spintronic applications may be fancy pale pink in coloration or may be colorless, or shades between colorless and fancy pale pink, depending on the number of NV centers present in the treated diamond material (more NV centers leading to a pinker color).

The technique of UV visible spectroscopy is well known in the art and involves measuring the 270 nm peak of the absorption spectrum of the diamond material.

The CVD diamond material that is irradiated in the method according to the present invention has an absorption spectrum with a total integrated absorption in the visible range from 350 nm to 750 nm such that more than 10% of the integrated absorption would be attributable to $N_s^0$ defects.

Methods of CVD diamond material growth are well established and have been described extensively in the patent and other literature, for example in WO 03/052177. These previously documented methods for growing CVD diamond material are believed to result in a diamond material with an absorption spectrum with a total integrated absorption in the visible range from 350 nm to 750 nm such that less than 10% of the integrated absorption would be attributable to $N_s^0$ defects. In other words the contribution of other defects to the visible part of the spectrum would be greater than 90%. Since these other defects are known to lead to the characteristic brown coloration of CVD diamond containing nitrogen, these known prior art CVD growth processes are not suitable for directly growing the CVD diamond material used in the method of the present invention.

According to one method according to the invention the CVD diamond material may be grown by a CVD process which results in a CVD diamond material sample comprising the target $[N_s^0]$ concentration and optionally having an absorption spectrum with a total integrated absorption in the visible range from 350 nm to 750 nm such that greater than 10% of the integrated absorption is attributable to $N_s^0$. This embodiment may be achieved by using as the source gas in the CVD process a gas containing carbon, hydrogen, nitrogen and oxygen, rather than the more usual carbon hydrogen and nitrogen. In particular, the CVD diamond material that is irradiated in step (i) of the method according to the first aspect of the invention may be grown directly by the process described in GB application GB0922449.4 and U.S. provisional application Ser. No. 61/289,282, the entire disclosures of which are incorporated herein by reference. Specifically the method involves providing a substrate; providing a source gas; dissociating the source gas; and allowing homoepitaxial diamond synthesis on the substrate; wherein the synthesis environment comprises nitrogen at an atomic concentration of from about 0.4 ppm to about 50 ppm; and wherein the source gas comprises: a) an atomic fraction of hydrogen, $H_f$, from about 0.40 to about 0.75; b) an atomic fraction of carbon, $C_f$, from about 0.15 to about 0.30; c) an atomic fraction of oxygen, $O_f$, from about 0.13 to about 0.40; wherein $H_f+C_f+O_f=1$; wherein the ratio of atomic fraction of carbon to the atomic fraction of oxygen, $C_f:O_f$, satisfies the ratio of about 0.45:1<$C_f:O_f$<about 1.25:1; wherein the source gas comprises hydrogen atoms added as hydrogen molecules, $H_2$, at an atomic fraction of the total number of hydrogen, oxygen and carbon atoms present of between 0.05 and 0.40; and wherein the atomic fractions $H_f$, $C_f$ and $O_f$ are fractions of the total number of hydrogen, oxygen and carbon atoms present in the source gas. This method of growing CVD diamond material shall be referred to in the specification as the "added oxygen CVD growth process".

Depending on the exact process parameters used (for example substrate temperature, pressure, power, the amount of nitrogen in the source gas), the above added oxygen CVD growth process may result directly in providing a diamond material in which greater than 10% of the integrated absorption in the visible range from 350 nm to 750 nm is attributable to $N_s^0$ defects, or not. In general the added oxygen CVD growth process allows a skilled worker to introduce higher percentages of nitrogen than would be possible with standard CVD processes, while reducing the number of other defects leading to the brown coloration. Thus, the present invention also envisages using the added oxygen CVD growth process to introduce such high concentrations of nitrogen that the number of other defects is also significant and the resultant grown diamond material has less than 10% of the integrated absorption in the visible spectrum from 350 nm to 750 nm attributable to $N_s^0$ defects. Such diamond material could then be treated by a subsequent anneal as described hereinafter. Tailoring the added oxygen CVD growth process so as to produce the desired diamond material defect concentration, and consequent absorption spectrum, will be a matter of simple experimentation for the person skilled in the art.

The CVD diamond material grown by the added oxygen CVD growth process, when it results in a diamond in which greater than 10% of the integrated absorption in the visible range from 350 nm to 750 nm is attributable to $N_s^0$ defects, may be used directly as the CVD diamond material in the method according to the invention, this diamond being irradiated to form the irradiated diamond material, and then subjected to an anneal at a temperature of at least 700° C. and at most 900° C. for at least 0.1 hour to form the treated diamond material containing NV centers ("the NV-forming anneal"). This route from CVD growth stage to formation of treated diamond is illustrated as "route A" in FIG. 2 of the accompanying drawings. Our investigations have shown that there does not appear to be a maximum annealing time. For practical reasons, the maximum anneal time is optionally at most 100 hours or at most 50 hours, or at most 24 hours.

Instead of being used directly as the diamond material in the method according to the invention, the CVD diamond material grown by the added oxygen CVD growth process, when it results in a diamond in which greater than 10% of the integrated absorption in the visible range from 350 nm to 750 nm is attributable to $N_s^0$ defects, may be considered to be a added-oxygen-CVD-grown precursor diamond material that is annealed at a temperature of at least 1600° C., for example about 1800° C., or about 2000° C. in order to form the CVD diamond material that is irradiated and NV-forming annealed according to methods of the invention. This first annealing at a temperature of at least 1600° C. shall be referred to hereinafter as the "preliminary high temperature annealing process" where such nomenclature is desirable for clarity to distinguish it from the subsequent NV-forming anneal completed after the irradiation stage. A CVD diamond material made by the added oxygen CVD growth process and then subjected to the high temperature annealing process will form the provided CVD diamond, which CVD diamond having an absorption spectrum with a total integrated absorption in the visible range from 350 nm to 750 nm such that more than 10% of the integrated absorption is attributable to $N_s^0$. This route to the CVD diamond material is illustrated as route B in FIG. 2. When this route is followed, both the added-oxygen-CVD-grown precursor-diamond-material and the provided diamond material have a total integrated absorption in the visible range from 350 nm to 750 nm such that more than 10% of the integrated absorption would be attributable to $N_s^0$ defects. It is thought that the preliminary high temperature annealing process may reduce still further any X defects in the grown CVD diamond material, which may be advantageous for certain embodiments.

Another possibility is for CVD diamond material to be grown using a more conventional CVD process, for example of the type disclosed in WO 03/052177. Such a process, as noted above may result in a diamond material with an absorption spectrum with a total integrated absorption in the visible range from 350 nm to 750 nm such that less than 10% of the integrated absorption would be attributable to $N_s^0$ defects. In other words the contribution of other defects to the visible part of the spectrum would be greater than 90%. We shall refer to this diamond material as the "traditional-CVD-grown precursor diamond material" in this specification, the word precursor being used to show it is a grown CVD diamond material that is different from and precedes the "provided CVD diamond material" that is the diamond material that is irradiated and annealed by the method of the present invention. The word traditional being used to distinguish the route to the CVD grown precursor material from that described for route B above.

We have found that if selected traditional-CVD-grown precursor diamond material (or indeed CVD diamond material grown by the added oxygen process in such a way that it results in diamond in which less than 10% of the integrated absorption in the visible range from 350 nm to 750 nm is attributable to $N_s^0$ defects) is subjected to the above mentioned high temperature annealing process the result is a diamond material with an absorption spectrum with a total integrated absorption in the visible range from 350 nm to 750 nm such that more than 10% of the integrated absorption is attributable to $N_s^0$ defects, i.e. it results in the CVD diamond material that is irradiated and annealed according to the present invention. That provided diamond material can then be irradiated and subject to the final NV-forming annealing process as before. This route is shown in FIG. 2 as "route C".

Without limiting the invention in any way, it is thought that the high temperature annealing process causes the aforementioned X defects to reconfigure in some way, so that they contribute less to visible range of the absorption spectrum.

Routes A, B and C described above each produce the provided CVD diamond that is irradiated and annealed in the method according to the invention, and advantageously results in a CVD diamond comprising $N_s^0$, but having an absorption spectrum with a total integrated absorption in the visible range from 350 nm to 750 nm such that greater than 10% of the integrated absorption is attributable to $N_s^0$. In practice it is thought desirable, at least for some applications, for this ratio to be as high as possible. This means that the preliminary process, e.g. of routes A, B and C, result in a CVD diamond that does not contain, or contains at a minimal or reduced level, the X defects described hereinbefore as being responsible for the 350 nm, 510 nm, and ramp feature seen in the absorption spectrum of CVD diamond containing nitrogen, where X defects are thought to be responsible for the brown coloration.

Where route C is followed to form the provided CVD diamond, then the X defects are removed by the preliminary high temperature annealing process, or substantially minimized, or at least reduced. Where route A is followed i.e. the added oxygen CVD growth process under conditions where it results in diamond in which greater than 10% of the integrated absorption in the visible range from 350 nm to 750 nm is attributable to $N_s^0$ defects) is used, then the said X defects are not formed, or are formed to a minimal or reduced extent compared to processes without the additional oxygen. Where route B i.e. the added oxygen process (under conditions where it results in diamond in which greater than 10% of the integrated absorption in the visible range from 350 nm to 750 nm is attributable to $N_s^0$ defects) combined with a preliminary high temperature annealing process then the said X defects are still further reduced, if any were formed in the growth process.

The said provided CVD diamond, which may be provided by following one of the above described routes A, B or C, consequently has a color which is not dominated by brown defects that do not contain nitrogen. It may be a yellow hue, that color being dominated by the presence of single substitutional nitrogen $N_s^0$ or it may be a substantially colorless where lower concentrations of $N_s^0$ are present.

It is possible to differentiate, from measurements made on the final treated CVD diamond material, between diamonds made by a process involving a high temperature anneal (routes B and C in FIG. 2) and those made by process that does not involve a high temperature anneal (e.g. route A in FIG. 2)

CVD diamond material which has undergone the high temperature annealing process can be distinguished from that which has not, since CVD diamond material which has undergone the high temperature annealing process will contain one or more of the spectroscopic characteristics set out in Table 2A:

TABLE 2A

| Feature | Limit | Experimental Comment |
| --- | --- | --- |
| 3107 cm$^{-1}$ | Present (>0.1 cm$^{-1}$) | Measured by room temperature FTIR with 1 cm$^{-1}$ wavenumber resolution |
| 3123 cm$^{-1}$ | Low or absent (<0.1 cm$^{-1}$) | Measured by room temperature FTIR with 1 cm$^{-1}$ wavenumber resolution |
| 1405 cm$^{-1}$ | Present (>0.05 cm$^{-1}$) | Measured by room temperature FTIR with 1 cm$^{-1}$ wavenumber resolution |

TABLE 2A-continued

| Feature | Limit | Experimental Comment |
|---|---|---|
| 1453 nm | Present (>0.05 cm$^{-1}$) | Measured by room temperature FTIR with 1 cm$^{-1}$ wavenumber resolution |
| 1359 nm | Low or absent (<0.1 cm$^{-1}$) | Measured at room temperature using a Perkin Elmer lambda 19 spectrometer or equivalent with slit width of 1 nm and scan speed of 60 nm/min |
| Phosphorescence | Observable using DiamondView ™ | |
| 503 nm (H3 defect) | Present (>10% of the normalized Raman) | Observable in PL (e.g. 488 nm excitation) measured at 77 K. |

The above spectroscopic properties will not be present in a treated CVD diamond material that has not undergone the high temperature anneal in the process to form the provided CVD diamond material.

In a first set of embodiments of methods according to the invention the treated diamond material (after irradiation and NV-forming annealing) will have one or more of the characteristics set out in Table 2A. Such a diamond material will generally be one which has been subjected to a high temperature annealing process as part of its history.

In a second set of embodiments of methods according to the invention the treated diamond material (after irradiation and NV-forming annealing) will have absorption characteristics falling outside one or more of those set out in Table 2A; for example the treated diamond material may have an absorption coefficient at 3107 cm$^{-1}$ that is absent or less than or equal to 0.1 cm$^{-1}$. Such a diamond material will generally be one which has not been subjected to a high temperature annealing process as part of its history.

While there may be some overlap between the first and second set of embodiments, generally materials that have been subjected to a high temperature annealing process will have all of the characteristics set out in Table 2A, whereas those that have not been subjected to the high temperature annealing process will have characteristics falling outside all of those set out in Table 2A.

For certain embodiments, it is desirable that the absolute value of $N_s^0{}_{(contrib)}$ is controlled for the provided diamond. It has been found that there is an advantageous minimum concentration of $N_s^0$ defects in the provided diamond such that sufficient NV color centers are created on subsequent irradiation and annealing to generate the desired color and/or spintronic properties. On the other hand, it has been found that if the concentration of $N_s^0$ defects is too high in the provided CVD diamond material, then following irradiation and NV-forming annealing the diamond material will have a darker color, which may be undesirable in ornamental applications and/or lead to a reduced decoherence time T2 in spintronic applications.

For certain embodiments according to the invention, particularly for embodiments for making fancy pink colored diamond material, the provided CVD diamond material may have a maximum concentration of $[N_s^0]$ defects of at most 5 ppm, (or at most 3 ppm, or at most 1 ppm, or at most 0.6 ppm, or at most 0.4 ppm, or at most 0.25 ppm, or at most 0.1 ppm, and/or may have a minimum concentration of $[N_s^0]$ of 0.1 ppm.). For other embodiments, particularly for embodiments for spintronic applications, the provided CVD diamond material may have a minimum concentration of $[N_s^0]$ of 0.005 parts per billion (ppb). A lower $[N_s^0]$ concentration may be relevant for spintronic applications, since there is not a need to introduce sufficient NV centers to provide a fancy pale pink coloration (though as explained earlier diamond material with a pink coloration may be used in some cases for spintronic applications. For spintronic applications the maximum $[N_s^0]$ concentration in the provided CVD diamond material may be at most 5 ppm, (or at most 3 ppm, or at most 2 ppm, or at most 1 ppm, or at most 0.6 ppm, or at most 0.4 ppm, or at most 0.25 ppm, or at most 0.1 ppm, and or at most 0.05 ppm. This optional maximum concentration for spintronic applications is set because at higher concentrations it is difficult or even impossible to resolve single defect centers.

Those skilled in the art will recognize that while controlling the $[N_s^0]$ concentration in the provided diamond it is also advantageous to control the total acceptor concentration [A], which for example might be associated with substitutional boron concentration $[B_s^0]$. In diamond containing both boron and nitrogen the following charge transfer is known to happen:

$$N_s^0 + B_s^0 \rightarrow N_s^+ + B_s^-.$$

The effect of this is to offer competing defect processes for the formation of NV$^-$ defect centers.

Further, the presence of $B_s^0$ in sufficient concentrations can introduce blue color to the provided diamond which can obscure any produced pink color that is desired for the above mentioned ornamental applications.

Further, the presence of $B_s^0$ and the competing charge transfer processes it can drive in the material can lead to detrimental effects in applications such as spintronics. For example it can reduce both the T2 value and also the spectral stability of the photoluminescence associated with the NV$^-$ defect.

For certain embodiments according to the invention, it is desirable for the provided diamond to have a total acceptor concentration (e.g. from substitutional boron measured for example using bound exciton or electrical measurements known to those skilled in the art) less than $5\times10^{16}$ cm$^{-3}$, or less than $5\times10^{15}$ cm$^{-3}$, or less than $5\times10^{14}$ cm$^{-3}$, or less than $5\times10^{13}$ cm$^{-3}$ or less than $1\times10^{13}$ cm$^{-3}$.

Alternatively it is desirable for the provide diamond to have a $[N_s^0]$:[A] ratio (where [A] might be $B_s^0$)>2:1, or >10:1, or >30:1, or >60:1, or >100:1, or >1000:1.

It is known that if there is uncompensated boron in a diamond material this may be compensated for by irradiating to introduce isolated vacancies, the isolated vacancies combining with the boron. So in some embodiments according to the invention, if the diamond material does contain uncompensated boron (for example in a concentration>5×1015 cm-2) then the irradiation step may be carried out to introduce sufficient isolated vacancies to compensate the boron and to provide excess that will then form NV centers on annealing. The level of additional irradiation needed for boron compensation could be determined empirically by the person skilled in the art. Total boron in the material may be quantified using techniques known to the skilled man. Secondary ion mass spectroscopy (SIMS) may be used for example to ascertain the total boron concentration. The uncompensated boron may be ascertained using either the induced absorption measured in the infrared part of the diamond spectrum, or through Hall or electrical transport measurements, in a manner known to the skilled person.

Since diamond is a wide band gap semiconductor, diamond material, and in particular diamond material containing defects, does not necessarily have a well defined Fermi level. At room temperature (i.e. about 300 K), charge that is initially trapped at a defect having an energy level that is relatively shallow compared with either the valence band maximum or the conduction band minimum, will reach an equilibrium distribution via transport after thermal excitation to the valance or conduction bands. However, diamond material may contain defects having energy levels that are relatively deep within the band gap such that, at room temperature, there is a low probability for electrons to be thermally excited between the valence band and the defect or between the defect and the conduction band. When such defects are present, the charge distribution across the various defects may depend on the thermal and excitation history of the sample. In such cases, to the extent that the optical absorption properties of the material depend on the charge state of defects within it, they will also depend on the thermal and excitation history of the sample. For example, the proportions of isolated substitutional nitrogen defects that exist in the neutral charge state may depend on the prior thermal and excitation history of the sample and therefore the proportion of the total optical absorption that is attributable to this neutral defect will also depend on the history of the sample.

For the avoidance of doubt, when the history of the sample is not specified the properties of the material described in this invention should be taken to be properties that can be measured with no additional excitation of the sample during the measurement other than that required in making the measurement.

The properties may be measured after the sample has been irradiated with light from a deuterium lamp under the following conditions:
(a) distance between the sample and the lamp of about 10 cm or less;
(b) lamp operating electrical power of at least 10 Watts; and
(c) a duration of between about 5 minutes and about 60 minutes.

In particular, the properties are measured after the sample has been irradiated with light from a deuterium lamp under the following conditions:
(a) distance between the sample and the lamp of 8 cm;
(b) lamp operating electrical power of 10 Watts; and
(c) a duration of 10 minutes.

Deuterium lamps (also known as "deuterium arc lamps") are widely used in spectroscopy where a continuous output is required between wavelengths of about 180 nm and about 370 nm.

The CVD diamond material that is irradiated and annealed in embodiments of methods of the invention may have at least about 50%, alternatively at least about 80%, alternatively at least about 90%, alternatively at least about 95% of the volume of the synthetic CVD diamond material formed from a single growth sector. This single growth sector may be a {100} or a {110} growth sector. The material of the single growth sector may have $N_s^0$ levels within ±20% of the mean for greater than about 50% of the volume of the growth sector, alternatively greater than about 60% of the volume of the growth sector, alternatively greater than about 80% of the volume of the growth sector. Using a synthetic CVD diamond material that has been grown from a single growth sector is advantageous. Surfaces with different crystallographic orientations exhibit strongly differential uptake of nitrogen impurity and a synthetic CVD diamond material comprising more growth sectors therefore tends to show more undesirable zones with different color, resulting from the different concentrations of $N_s^0$ in different growth sectors.

Another advantage of having CVD diamond from predominantly a single growth sector is that in different growth sectors there may be different quantities, distributions and types of defects other than $N_s^0$, i.e. different $N_s^0$:X defect ratios. The optimum irradiation and anneal treatment will therefore be different for different sectors, which would not be practically possible.

The CVD diamond material used in embodiments of methods of the present invention, and also the treated CVD diamond material resulting from embodiments of methods of the present invention may form part of a larger piece of diamond material. For example, a CVD diamond layer may be grown with no nitrogen in the source gas, so that that layer contains substantially no $N_s^0$ defects. Then the source gas could be adjusted to incorporate nitrogen and a subsequent layer may be grown containing nitrogen, and having immediately (if the growth process is appropriate), or after a preliminary high temperature annealing process, an absorption spectrum where the limits defined by the main method claim for contribution to the total integrated absorption spectrum by the $N_s^0$ defects are satisfied. Then if the whole diamond (or only the new growth if masking is used) is irradiated and then subject to the NV forming anneal then NV centers will form in the said subsequent layer only of the grown and treated CVD diamond material. As would be apparent to the person skilled in the art multiple layers could also be grown with the appropriate nitrogen and $[N_s^0]$ defect concentrations, so that the CVD diamond material used in embodiments of methods according to the invention forms part, e.g. one or multiple layers of a larger piece of diamond material. As another possibility control of the irradiation may be used such that the treated CVD diamond material used in embodiments of methods of the present invention may form part of a larger piece of diamond material. It is well known that the depth of penetration of irradiation is dependent on the energy of the irradiation. So in some embodiments an irradiation energy is selected such that the irradiation penetrates only part of the depth of a CVD diamond material. This means that isolated vacancies would be introduced only in the penetrated part of the irradiated CVD diamond material, and after the subsequent NV forming annealing process NV centers would be introduced substantially only into the penetrated part of the diamond material.

Where the CVD diamond material that is both irradiated and annealed provides only part of a larger piece of diamond material, as discussed above, that part alone may have the advantageous optical or spintronic properties described for certain embodiments of the invention. Thus for example a top or embedded layer or layers of a large piece of CVD diamond material may have a pale pink coloration. Where any other non-pale-pink layers are substantially colorless the color of the larger piece of diamond material is dominated by the pale pink layer(s). Similarly a top, or embedded layer or layers of a large piece of CVD diamond material may have improved spintronic properties.

In some embodiments according to the invention at least 50% or at least 60% or at least 70% or at least 80% or at least 90% or substantially the whole diamond stone may have substantially the same color and/or substantially uniform [NV] concentration (by which we mean the same [NV] concentration±20%).

In other embodiments according to the invention of diamond stone may comprise layers or pockets of diamond material of the same color and/or substantially uniform [NV] concentration.

Thus as can be seen, the source gas during the growth process can be controlled to produce a CVD diamond material forming part of a larger piece of diamond material; also the irradiation energy can be controlled to produce a CVD diamond material forming part of a larger piece of diamond material. The NV forming annealing process can only be applied to the bulk of any larger piece of diamond material; that is you cannot easily anneal only part of a whole stone.

Steps (i) and (ii) of methods according to the invention comprise irradiating the provided diamond and annealing the irradiated diamond respectively. The step of irradiation acts to introduce isolated vacancies V into the diamond, and the subsequent annealing step acts to create NV centers as discussed hereinbefore.

The method according to one embodiment of the invention comprises irradiating the CVD diamond material. In one embodiment the step of irradiating the CVD diamond material introduces into the material (prior to its irradiation) an isolated vacancy concentration $[V_T]$ in parts per million (ppm) which is greater than $0.1 \times [N_s^0]$ concentration in ppm in the CVD diamond material (prior to its irradiation), and is less than $0.9 \times [N_s^0]$ concentration in ppm in the CVD diamond material (prior to its irradiation) i.e.:

$$0.1 \times [N_s^0] < [V_T] < 0.9 \times [N_s^0]$$

Generally, the isolated vacancy concentration $[V_T]$ is given by the sum of $[V^0]$ and $[V^-]$, where $[V^0]$ is the concentration of neutral isolated vacancies, and $[V^-]$ is the concentration of negatively charged isolated vacancies, both in ppm, and both $[V^0]$ and $[V^-]$ concentrations are determined from the GR1 and ND1 absorption features of the absorption spectrum of the irradiated diamond in a manner described hereinafter.

It is possible that the irradiation might introduce isolated vacancies in other forms, e.g. as pairs or in possible isolated positively charged vacancies $[V^+]$. However, the inventors did not observe any features in the irradiated diamond material that could be associated with such vacancy pairs or positive vacancies.

Electron, neutron or gamma radiation can be used. Electron irradiation is preferable over neutron irradiation as the higher energy neutrons can cause cascade damage which is undesirable as the formed vacancy chains can be more difficult to anneal out and lead to detrimental color effects and reduced T2.

Electron irradiation is typically carried out with a beam source in the energy range 0.8 MeV to 12 MeV. For some embodiments the energy is that which introduces a near uniform concentration of isolated vacancies in the N doped diamond, while minimizing the formation of cascade damage e.g. vacancy chains. For the optimum results reported here it was found that 4.5 MeV provided a good compromise between these two factors.

For larger samples, rotation of the sample during irradiation, or repeated rotation followed by irradiation, can assist in achieving the uniformity of the created isolated vacancies throughout the volume of the stone.

Factors such as diamond temperature, beam energy, beam flux, and even the starting diamond's properties can affect the $[V_T]$ produced for a fixed experimental irradiation set-up and time. Irradiation is typically carried out with the sample mounted under ambient conditions ~300 K with only minimal temperature rise during the irradiation dose (e.g. less than 100 K). However, factors such as beam energy and beam flux can lead to sample heating. In some embodiments the sample is held as cold as possible (with even cryogenic cooling at 77 K being advantageous under some circumstances) to enable high dose rates without compromising temperature control and thus minimize the irradiation time. This is advantageous for commercial reasons. Calibration of the dose applied against the isolated vacancies produced for the particular provided diamond being used in order to satisfy these limits on $[V_T]$ concentration introduced will form part of the skilled person's responsibilities before carrying out the method of the present invention. Such calibration techniques are routine for the person skilled in the art.

Advantageously the proportion of NV defects compared to all other defects, now described as Z is as high as possible. Specifically, at least for some embodiments, it is desirable for $NV^-$:Z to be as high as possible for spintronic applications, whereas for the fancy pale pink color it is desirable for the total NV ($[NV^-]+[NV^0]$) concentration to Z to be as high as possible. Once conversion of $N_s^0$ defects to NV centers has taken place, the remaining defects, Z, include: (i) the previously identified "X defects" previously noted as responsible for the 350 nm, the 510 nm peak, and the ramp factor in the absorption spectrum; (ii) excess isolated vacancies; (iii) excess vacancy chains $V_{chains}$; (iv) interstitial defects that have not annealed out, and (v) any un-converted $N_s^0$ defects. For gem or other colored diamond material applications this is because Z defects introduce other colors into the diamond which would mask the pink color or simply reduce the lightness. For spintronic applications it is because these Z defects can lead to a reduction in T2 or reduced spectral stability of the $NV^-$ zero phonon line.

For both colored diamond material and/or spintronic applications, it is advantageous to have an [NV] concentration above a certain minimum level but below a certain maximum level. For the spintronic applications the [NV] concentration may be in the range $10^7 < [NV^-] < 10^{13}$ cm$^{-3}$, or $10^9 < [NV^-] < 10^{11}$ cm$^{-3}$. For the colored diamond material applications, e.g. for a 0.5 ct round brilliant cut gem, the $[NV_T]$ (=[NV]+$[NV^0]$) concentration may be $10^{14} < [NV_T] < 10^{18}$ cm$^{-3}$ or $5 \times 10^{15} < [NV_T] < 9 \times 10^{16}$ cm$^{-3}$.

Concentrations in ppm given in the present specification for the different defects, $[NV^{+/-}]$ and $[V^{0/-}]$, may be calculated in a known standard manner by integrating the area of peaks from the absorption spectrum of the diamond usually collected at liquid nitrogen temperatures and using published coefficients for comparison to calculate concentration. For concentrations of NV centers and isolated vacancies, the spectra are advantageously obtained at 77 K, using liquid nitrogen to cool the samples, since at that temperature sharp peaks at ~741 nm and ~394 nm attributable to $V^0$ and $V^-$ and at 575 nm and 637 nm are seen attributable to $NV^0$ and $NV^-$ defects respectively. The coefficients that are used for the calculations of concentrations of NV centers and isolated vacancies in the present specification are those set out by G. Davies in Physica B, 273-274 (1999), 15-23, as detailed in Table 3 below.

TABLE 3

| Defect [label] | Calibration (meV cm$^{-1}$) |
|---|---|
| $V^-$ [ND1] | $A_{ND1} = (4.8 \pm 0.2) \times 10^{-16}$ [$V^-$] |
| $V^0$ [GR1] | $A_{GR1} = (1.2 \pm 0.3) \times 10^{-16}$ [$V^0$] |
| $NV^-$ | $A_{NV}^- = (1.4 \pm 0.35) \times 10^{-16}$ [$NV^-$] |
| $NV^0$ | $A_{NV}^0 = (1.4 \pm 0.35) \times 10^{-16}$ [$NV^0$] |

In Table 3, "A" is the integrated absorption (meV cm$^{-1}$) in the zero phonon line of the transition, measured at 77 K, with the absorption coefficient in cm$^{-1}$ and the photon energy in meV. The concentration is in cm$^{-3}$.

Control of the irradiation and anneal treatment is therefore advantageous in order to achieve the desired high NV:Z ratio in the treated diamond for certain embodiments. Table 4 sets out the matrix to be considered when selecting embodiments of irradiation periods and annealing times.

TABLE 4

| Irradiation dose | Anneal time | Result |
| --- | --- | --- |
| Lower than optimum | Any | Insufficient NV formed - material remains colorless and NV:Z ratio is too low for quantum applications. |
| Optimum | Optimum or longer than optimum | Maximum number of NV centers formed. NV:Z defect ratio is maximized. All excess isolated vacancies are removed (as indicated by absence of GR1 and ND1 centers on spectrum). Minimal concentration of other vacancy/interstitial complexes formed. Diamond material has bright pale pink color. |
| Longer than optimum or optimum | Shorter than optimum | Too many isolated vacancies remaining in the material (as indicated by GR1 and ND1 centers of the absorption spectrum of the treated diamond material). Result is a diamond material having a flat spectrum and a grey component or appearance. |
| Longer than optimum | Optimum or longer than optimum | Insufficient nitrogen to continue to form NV centers. So excess vacancies remain (not combined with $N_s^0$ defects) either as isolated vacancies or vacancy complexes. NV:Z ratio is lower than optimum. |

An optimum irradiation dose for a given material can be empirically determined by irradiating the CVD diamond for a longer than ideal, annealing in steps and measuring the concentration of NV defects formed and V defects remaining. The concentration of NV centers formed will saturate out, the concentration of isolated vacancies consumed to reach this point is the optimum concentration of isolated vacancies (the target isolated vacancy concentration) to introduce into the material. The target isolated vacancy concentration may be controlled to within ±10% or to within ±8% or to within ±5%. A description of determination of target isolated vacancy concentration is given later in this specification with reference to the examples.

In general the greater the irradiation dose, the greater the number of isolated vacancies created. The exact position of the curve for different provided diamond materials will vary and is empirically determined for any particular sample. Curves for two different starting diamond materials (labeled A and B) are shown in FIG. 3.

The number of isolated vacancies created can depend not only on the period of the irradiation dose, but also on the number and nature of defects in the provided CVD diamond. Therefore to calculate the desired dose of electron irradiation the isolated vacancy production rate is also calculated for the given irradiation conditions as would be known to those skilled in the art. This procedure forms part of the calibration of dose applied against isolated vacancies produced referred to earlier.

Therefore the position of the curve can be found and the irradiation dose required to produce the optimum isolated vacancy concentration can be extrapolated. For 4.5 MeV electrons the inventors found electron irradiation doses in the range $3\times10^{16}$ to $3\times10^{17}$ $e^-/cm^2$ most desirable, corresponding to isolated vacancy $(V^0+V^-)$ concentrations post irradiation of 0.04-0.3 ppm, and in the range from 10% to 90% of the $N_s^0$ in the starting material.

As noted above, particularly with respect to table 4 the NV forming annealing process following irradiation converts at least some of the isolated vacancies introduced by the irradiation process to NV centers. Non-converted isolated vacancies may remain as single isolated vacancies or may, as a result of the NV forming annealing process, agglomerate together to form so-called "vacancy chains". For diamonds with a higher than optimum V concentration, after the desired anneal to maximize the formation of NV it was found that the absorption spectrum contained very few isolated vacancies characterized by low levels of $V^0$ and $V^-$ defects, but a characteristic rise in absorption from 450 nm. Without being bound by theory this is thought to be associated with the formation of V chains. The strength of this feature was characterized by the measured increase in absorption after the irradiation and annealing stages in the 200-450 nm region, with a possible maximum value at 250 nm of <20 $cm^{-1}$, or <15 $cm^{-1}$, or <10 $cm^{-1}$, or <5 $cm^{-1}$. FIG. 4 shows how the absorption at 250 nm increases as the formation of vacancy chains increases. Their presence affects both the optical and spintronic properties of any diamond material containing them, generally in a disadvantageous manner.

In some embodiments the irradiated diamond material may be subjected to a NV forming anneal at a temperature of at least 700° C., or at least 750° C. in a stabilizing atmosphere (e.g. vacuum<$10^{-5}$ mTorr). For some embodiments the maximum annealing temperature may be less than 900° C., or less than 850° C., and may be 800° C. For some embodiments the annealing period may be at least 0.1 hours and may be at least 2, 3, or 6 hours. We have found that prolonging the anneal is not disadvantageous in terms of affecting the properties of the diamond material, but beyond a certain period of anneal, does not change the properties of the diamond any further. Therefore for convenience and cost reasons annealing for periods beyond the time when properties stabilize is not usually carried out. The optimum annealing time is therefore considered to be until the properties of the diamond material substantially stabilize. Typically this optimum annealing period is in the range 6 to 10 hours, more advantageously for about 8 hours.

The concentration of [NV] and [V] defects are determined using low temperature absorption measurements using methodology described herein.

Based on the optimization of the irradiation dose and anneal conditions the treated diamond material, after the irradiation and NV-forming anneal steps, has one or more, and optionally all of the following characteristics as set out in Table 5:

TABLE 5

| | |
| --- | --- |
| [$V^0$] (GR1) | <0.3 ppm |
| | optionally <0.2 ppm |
| | optionally <0.1 |
| | optionally <0.05 ppm |
| | optionally <0.01 ppm |
| [$V^-$] (ND1) | <0.3 ppm |
| | optionally <0.2 ppm |
| | optionally <0.1 |

TABLE 5-continued

| | |
|---|---|
| [$N_s^0$] | optionally <0.05 ppm |
| | optionally <0.01 ppm |
| | optionally <5 ppm |
| | optionally <3 ppm |
| | optionally <1 ppm |
| | optionally <0.6 ppm |
| | optionally <0.4 ppm |
| | optionally <0.25 |
| | optionally <0.1 ppm |
| | optionally <0.05 ppm |
| V chain absorption at 250 nm | <20 cm$^{-1}$ |
| | optionally <15 cm$^{-1}$ |
| | optionally <10 cm$^{-1}$ |
| | optionally <5 cm$^{-1}$ |
| [$NV^-$ + $NV^0$]:[$N_s^0$] | >0.16 |
| | optionally >0.2 |
| | optionally >0.3 |
| | optionally >0.4 |
| | optionally >0.5 |

The treated diamond material, after the irradiation and NV-forming anneal steps may have a T2 measured at room temperature that is greater than 100 μs, or greater than 200 μs, or greater than 300 μs, or greater than 400 μs, or greater than 500 μs, or greater than 600 μs, or greater than 800 μs.

The spin coherence time (T2) of a single electron spin in a $NV^-$ center can be probed using Hahn echo decay. Adapted to optically detected magnetic resonance, the Hahn echo pulse sequence consists of the well-known $\pi/2$ - $\tau$ - $\pi$ - $\tau$ - $\pi/2$ series of microwave pulses. The last pulse is devoted to convert the spin echo phenomenon into populations, measurable by fluorescence detection. Prior to performing the Hahn echo decay measurement a single NV center is selected using a confocal microscope system with 532 nm excitation. This allows bulk samples to be scanned and individual NV centers selected. After selecting a NV center a Hanbury Brown-Twiss experiment is performed to determine that the center truly is singular. The results of the Hanbury Brown-Twiss experiment show a characteristic anti-bunching signature in the coincidence rate when there is only one NV center. Upon selection of a NV center the center is excited optically then a series of microwave pulses are used to observe the electron spin precession.

The main decoherence mechanism is spectral diffusion, that happens when the electron spins that generate the echo pulse are subject to fluctuating dipolar or hyperfine fields generated by nuclear spins. A stochastic theory of this effect can be derived by considering the electron spin Larmor frequency as a random variable. The amplitude of the echo pulse can be calculated using an ensemble average, equivalent to time averaging in a single-spin experiment. The result is $$A(2\tau) = \exp\left[-\frac{1}{6}\frac{\Delta^2}{T_m}(2\tau)^3\right]$$

where $\tau$ is the time interval between the $\pi/2$ and $\pi$ pulses, $\Delta$ is the parameter characterizing the local field relaxation, and where $T_m$ is the phase memory time.

In an otherwise perfect diamond lattice which only contains a low concentration of $NV^-$ (<$10^{11}$ cm$^{-3}$) centers, it is found that coupling to the $^{13}C$ nuclear spin S=½ remains a factor which limits the coherence time. The electron spin feels a change in the local field if a pair of nuclei changes its mutual spin configuration. Flip-flop processes are then strongly suppressed when in close proximity to the $NV^-$ center, because the nuclei experience a strong hyperfine coupling induced energy shift with respect to the spin bath. The decoupling radius δ is given by $$\delta = \left[2S\frac{\gamma_e}{\gamma_n}\right]^{1/4} a,$$

where S is the electron spin quantum number, $\gamma_e$ and $\gamma_n$ are the gyromagnetic ratios of electron and nuclear spins, and a is the average nearest neighbor separation between nuclear spins.

Methodology and the benefits of reducing the $^{13}C$ nuclear spin concentration are described in WO2010/010352 and WO2010/010344. The material of this invention could be incorporated into diamond with a higher $^{12}C$:$^{13}C$ ratio than typical natural abundance.

In one embodiment of the method according to the present invention the CVD processes carried out so that the diamond material that results is carbon 12 [$^{12}C$] enriched. As well known in the art, carbon exists in two isotopic forms: carbon 12 [$^{12}C$], and carbon 13 [$^{13}C$]. In naturally occurring diamond the percentage [$^{13}C$] concentration is typically 1.1%. For some applications, for example the spintronic applications of interest in the present specification, [$^{13}C$] nuclei act as additional spin defects. Therefore for some embodiments of processes according to the present invention the provided diamond material comprises less than 0.9 percent, optionally less than 0.6 percent, optionally less than 0.4 percent, optionally less than 0.2 percent, optionally less than 0.1 percent, optionally less than 0.01 percent, [$^{13}C$]. This [$^{13}C$] remains through irradiation and the NV-forming annealing process. Therefore in some embodiments of method according to the invention the treated (irradiated and NV-forming annealed) diamond material also comprises less than 0.9 percent [$^{13}C$].

An embodiment of the present invention also provides a diamond material made by a method according to the invention.

Another embodiment of the present invention provides a CVD diamond material which when in the form of a 0.5 carat RBC (Round Brilliant Cut) is graded pale pink.

The terminology fancy pale pink diamond material is defined as diamonds which have a clear and distinct pink color (Diamond grading ABC The Manual, by Verena Pagel-Theisen, Rubin & Son, Belgium, 9$^{th}$ Edition, 2001, Page 67).

Another embodiment of the present invention provides a pink CVD synthetic single crystal diamond having the following color characteristics, as set out in Table 6, measured for an equivalent 0.5 ct Round Brilliant Cut (RBC) diamond.

TABLE 6

| Characteristic | Range |
|---|---|
| Hue angle α | 0°-60° |
| | optionally 10°-55° |
| | optionally 15°-52° |
| C* | 2-20 |
| | optionally 3-15 |
| | optionally 3-10 |
| L* | >65 |
| | optionally >70 |
| | optionally >75 |
| | optionally >80 |

The color of the irradiated and annealed diamond can be quantified in a well established manner using "CIE L*a*b* Chromaticity Coordinates". The use of CIE L*a*b* Chromaticity Coordinates in diamond is described in WO 2004/022821, the entire disclosure of which is incorporated herein by reference. a* and b* are plotted as x and y axes of a graph and the hue angle is measured from the positive a* axis towards the positive b* axis. Thus a hue angle of greater than 90° and less than 180° lies in the upper left quadrant of the a*b* graph. In this scheme for describing color L* is the lightness and a fourth coordinate C* is the saturation.

The perceived color of an object depends on the transmittance/absorbance spectrum of the object, the spectral power distribution of the illumination source and the response curves of the observer's eyes. The CIE L*a*b* chromaticity coordinates (and therefore hue angles) quoted herein have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength $\lambda$
$L_\lambda$=spectral power distribution of the illumination
$x_\lambda$=red response function of the eye
$y_\lambda$=green response function of the eye
$z_\lambda$=blue response function of the eye
$X=\Sigma_\lambda[S_\lambda x_\lambda L_\lambda]/Y_0$
$Y=\Sigma_\lambda[S_\lambda y_\lambda L_\lambda]/Y_0$
$Z=\Sigma_\lambda[S_\lambda z_\lambda L_\lambda]/Y_0$
Where $Y_0=\Sigma_\lambda y_\lambda L_\lambda$
$L^*=116\,(Y/Y_0)^{1/3}-16$=Lightness (for $Y/Y_0>0.008856$)
$a^*=500[(X/X_0)^{1/3}-(Y/Y_0)^{1/3}]$ (for $X/X_0>0.008856$, $Y/Y_0>0.008856$)
$b^*=200[(Y/Y_0)^{1/3}-(Z/Z_0)^{1/3}]$ (for $Z/Z_0>0.008856$)
$C^*=(a^{*2}+b^{*2})^{1/2}$=saturation
$h_{ab}$=arctan $(b^*/a^*)$=hue angle Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is standard to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIE L*a*b* coordinates for the new thickness. In this way the dependence of the hue, saturation and lightness on optical path length can be modeled to give an understanding of how the color of diamond with given absorption properties per unit thickness will depend on the optical path length.

L*, the lightness, forms the third dimension of the CIE L*a*b* color space. It is useful to understand the way in which the lightness and saturation vary as the optical path length is changed for diamond with particular optical absorption properties. The method described in the preceding paragraph can also be used to predict how the L*C* coordinates of diamond with a given absorption coefficient spectrum depend on the optical path length.

The C* (saturation) numbers can be divided into saturation ranges of 10 C* units and assigned descriptive terms as below.
0-10 weak
10-20 weak-moderate
20-30 moderate
30-40 moderate-strong
40-50 strong
50-60 strong-very strong
60-70 very strong
70-80+ very very strong Similarly the L* numbers can be divided up into lightness ranges as follows:
5-15 very very dark
15-25 very dark
25-35 dark
35-45 medium/dark
45-55 medium
55-65 light/medium
65-75 light
75-85 very light
85-95 very very light There are four basic color tones defined by the following combinations of lightness and saturation:
Bright: Light and high saturation, Pale: Light and low saturation,
Deep: High saturation and dark, Dull: Low saturation and dark.

Embodiments with specified hue angle, and a*, b*, C* and L* values quoted in this specification provide a quantitative measure the quality and color of synthetic CVD diamond material of the present invention. These color properties are advantageous because they give the diamond a pink color and can be used for ornamental purposed such as gemstones for jewelry, or for colored filters or the like.

In some embodiments according to the second and third aspects of the present invention the diamond material has an absorption coefficient at 3107 cm$^{-1}$ that is absent or less than or equal to 0.1 cm$^{-1}$. In other embodiments according to the second and third aspects of the present invention the diamond material has absorption characteristics that fall outside one or more, in some cases all, of those set out in Table 2A. In still further embodiments according to the second and third aspects of the present invention the diamond material has absorption characteristics that fall within one or more, in some cases all, of those set out in Table 2A.

A fourth aspect of the present invention provides a CVD synthetic single crystal diamond material having the following characteristics:

| | |
|---|---|
| [V$^0$] GR1 | <0.3 ppm |
| [V$^-$] ND1 | <0.3 ppm |
| [N$_s^0$] | <0.5 ppm |
| [NV] | ≥10$^{12}$ cm$^{-3}$, optionally ≥10$^{13}$, optionally ≥10$^{14}$, optionally ≥10$^{15}$ |

The diamond material optionally has the following additional characteristic

| | |
|---|---|
| [V chains] absorption | <20 cm$^{-1}$ at 250 nm |

Such a diamond material may find application for fancy pale pink colored applications, or for spintronic applications.

For spintronic applications [NV$^-$] is optionally $\geq 10^{12}$ cm$^{-3}$, optionally $\geq 10^{13}$ cm$^{-3}$, optionally $\geq 10^{14}$ cm$^{-3}$, optionally $\geq 10^{15}$ cm$^{-3}$.

The diamond material optionally also, or alternatively, has the following additional characteristic:

| T2 | >100 μs |
|---|---|

Such a diamond material finds particular application for spintronics.

For some embodiments T2 is >200 μs, optionally >300 μs, optionally >400 μs, optionally >500 μs, optionally >600 μs, optionally >800 μs.

CVD synthetic single crystal diamond material having the above characteristics may be used for spintronic applications.

In some embodiments according to the present invention the ratio ([NV$^-$]+[NV$^0$])/[N$_s^0$] in the synthetic CVD diamond material is greater than 0.16.

In some embodiments according to the present invention the CVD synthetic single crystal diamond material contains at least 10$^7$ cm$^{-3}$ NV$^-$ centers, and/or at most 10$^{13}$ cm$^{-3}$ NV$^-$ centers. These values for the number of NV$^-$ centers are particularly applicable for spintronic applications.

For other embodiments, particularly, though not exclusively for fancy pale pink diamond material, the CVD synthetic single crystal diamond material may contain at least $9 \times 10^{15}$ cm$^{-3}$ NV$_T$ (=NV$^-$+NV$^0$) centers, especially a minimum of $10^{14}$ cm$^{-3}$ NV$_T$ centers and/or a maximum of $10^{18}$ cm$^{-3}$ NV$_T$ centers.

For other embodiments according to the invention the CVD synthetic single crystal diamond material contains at least 10$^7$ cm$^{-3}$ NV$^-$ centers, and/or at most 10$^{13}$ cm$^{-3}$ NV$^-$ centers. These numbers of NV$^-$ centers are particularly may be used for CVD diamond material according to the invention for spintronic applications.

Some embodiments according to the invention the CVD synthetic crystal diamond material according to the invention contains less than 0.9 percent $^{13}$C.

One application of CVD synthetic single crystal diamond material according to the invention is a gemstone for ornamental use, or any other industrial use making use of the pink coloration of the diamond material, for example filters or the like.

Another application of CVD synthetic single crystal diamond material according to the invention is a spintronic device.

As noted above, the diamond material may be a gemstone for ornamental purposes and optionally has pale tonal characteristics. As an alternative the diamond material may be a spintronic device. Other applications for the diamond material would be apparent to the person skilled in the art.

The present invention also provides use of a CVD synthetic single crystal diamond material according to the invention as a gemstone, and use of a CVD synthetic single crystal diamond material according to the invention as a spintronic device.

One embodiment of the invention provides a method of making diamond material of a pre-selected color, comprising irradiating CVD diamond material with electrons in an energy range 3-5 meV so as to introduce isolated vacancies into the CVD diamond material. The diamond material may also be annealed after irradiation to achieve the pre-selected color.

One embodiment of the invention provides a method of making a diamond material of a pre-selected color, by selecting or growing a starting CVD diamond material having pre-selected structure and associated color properties and irradiating and annealing the pre-selected or grown CVD diamond material so as to introduce color centers into the CVD diamond material to produce the said pre-selected color.

One embodiment of the invention provides a method of making a diamond material having pre-selected spintronic properties, by selecting or growing a starting CVD diamond material containing single substitutional nitrogen (N$_s^0$) and irradiating and annealing the pre-selected or grown CVD diamond material so as to introduce color centers into the CVD diamond material to produce the said pre-selected spintronic properties.

One embodiment of the invention provides a CVD diamond material which has a total isolated vacancy concentration greater than 0.04 ppm and less than 5 ppm.

One embodiment of the invention provides a CVD diamond material having a single substitutional nitrogen [N$_s^0$] concentration less than 5 ppm and a total isolated vacancy concentration greater than 0.04 ppm.

One embodiment of the invention provides diamond material having dislocations extending in a direction within 10° of the growth direction of the diamond material and a single substitutional nitrogen [N$_s^0$] concentration less than 5 ppm and a total isolated vacancy concentration greater than 0.04 ppm.

One embodiment of the invention provides diamond material having dislocations extending in a direction within 10° of the growth direction of the diamond material which when in the form of a 0.5 ct round brilliant cut (RBC) is graded fancy pale pink.

One embodiment of the invention provides diamond material having dislocations extending in a direction within 10° of the growth direction of the diamond material having the following color characteristics measured for an equivalent 0.5 ct RBC

| Characteristic | Range |
|---|---|
| Hue angle α | 0°-60° |
| C* | 3.0-20 |
| L* | >70 |

One embodiment of the invention provides jewelry comprising diamond material according to embodiments of the invention and a setting for the diamond material.

One embodiment of the invention provides a round brilliant cut diamond gemstone comprising diamond material according to embodiments of the invention.

Embodiments of the invention will now be described, by way of example, with reference to the accompanying drawings, wherein:

FIG. 1, which has been referred to above, shows a spectral decomposition of the UV/visible absorption spectrum for an orange/brown CVD synthetic diamond layer;

FIG. 2, which has been referred to above, is a flow chart that shows routes to the provided diamond material used in the method of the present invention and the subsequent treatment (irradiation and NV-forming anneal) steps;

EXAMPLES

Figure 1:
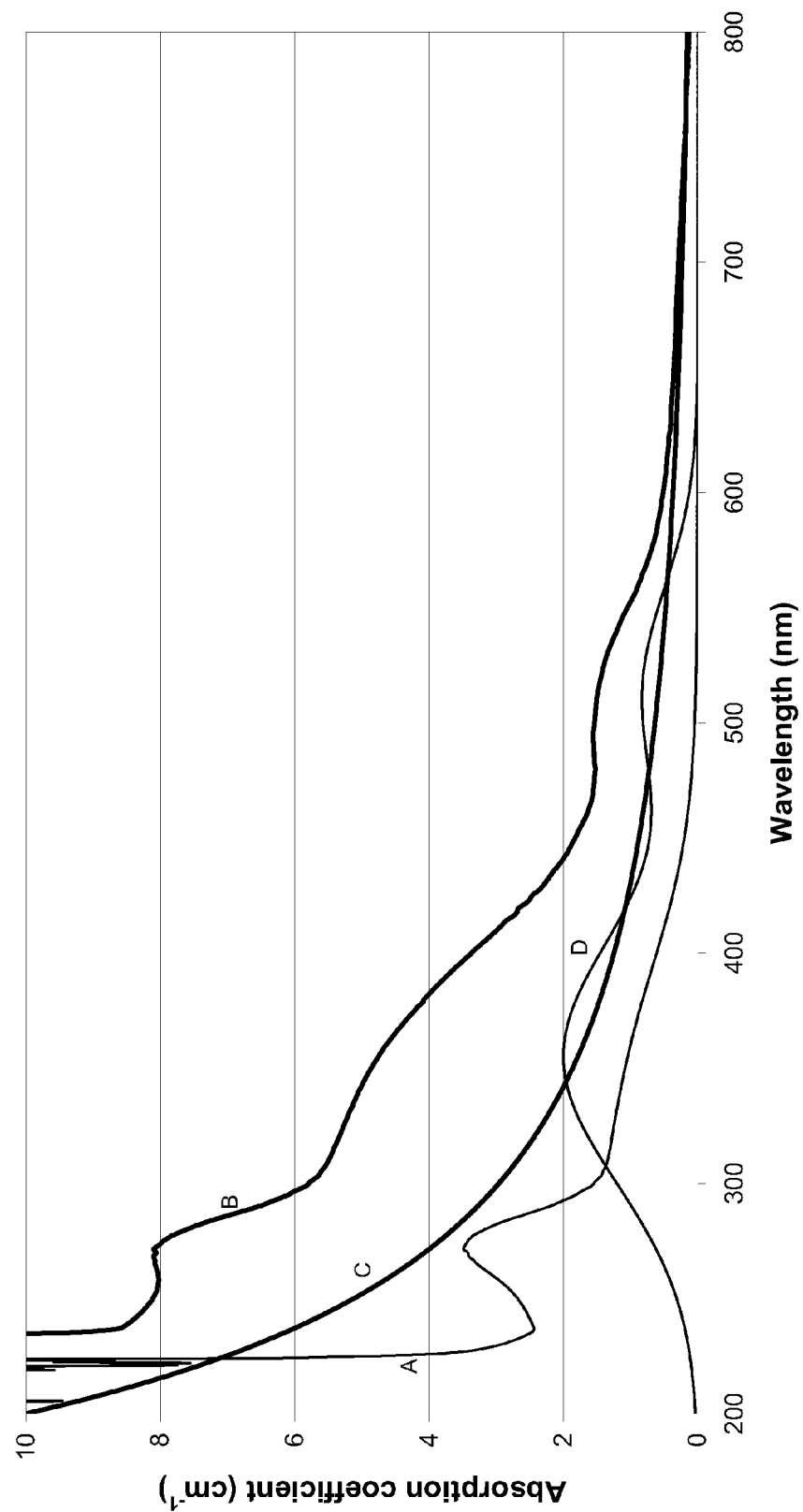

HPHT diamond substrates suitable for synthesizing single crystal CVD diamond of the invention were laser sawn, lapped into substrates, polished to minimize subsurface defects such that the density of defects is below $5 \times 10^3/mm^2$, and generally is below $10^2/mm$. Polished HPHT plates 3.6 mm×3.6 mm square by 500 µm thick, with all faces {100} having a surface roughness $R_Q$ at this stage of less than 1 nm were mounted on a refractory metal disk, and introduced into a CVD diamond growing reactor.

Growth stages
1) The CVD diamond reactor was pre-fitted with point of use purifiers, reducing unintentional contaminant species in the incoming gas stream to below 80 ppb.
2) An in situ oxygen plasma etch was performed using 50/40/3000 sccm (standard cubic centimeter per second) of $O_2/Ar/H_2$ and a substrate temperature of 760° C.
3) This moved without interruption into a hydrogen etch with the removal of the $O_2$ from the gas flow.
4) This moved into the growth process by the addition of the carbon source (in this case $CH_4$) and dopant gases. For these examples the $CH_4$ flowing at 165 sccm, nitrogen was present in the process gas at different levels for the different samples (as set out in Table 7), provided from a calibrated source of for example 100 ppb $N_2$ either as air in Ar or $N_2$ in $H_2$, and for some examples $O_2$ was also present in the process gas.

Table 7

| Example | Nitrogen dopant present in the process gas (ppm) | Oxygen flow present in the process gas (ppm) |
|---|---|---|
| 1 | 0.7 | 0 |
| 2 and 7 | 1.8 | 0 |
| 3-6 | 1.0 | 13740 |

5) On completion of the growth period, the substrate was removed from the reactor and the CVD diamond layer removed from the substrate by laser sawing and mechanical polishing techniques.
6) This produced a CVD diamond sample which had typical dimensions ~3.1×5×5 mm.

This grown CVD diamond is the diamond material that is irradiated and annealed according to embodiments of method of the present invention.

The electron irradiation was carried out with a 4.5 MeV electron beam source to a dose of $2.6 \times 10^{17}$ e-/cm² (equivalent to 15 minutes on 50% scan-width and 20 mA beam current). Diamond samples to be irradiated are mounted in indium on a water cooled copper block to prevent the samples being heated above 350 K.

All NV forming anneals described in the examples were done in an Elite tube furnace (model TSH 16/50/180-2416CG and 2716O/T). The annealing was done under in a vacuum of $<1 \times 10^{-5}$ mbar, by ramping the temperature between room temperature and the dwell temperature at 3° C./min.

Table 8 shows the $N_s^0$ concentrations in ppm, and the percentage of the total integrated absorption attributable to $N_s^0$ defects for the diamond material samples provided as above. The table records the consequent color of the diamond material, concentrations of $NV^0$, $NV^-$, $V^0$ and $V^-$, $N_S^0$ and absorption at 250 nm (indicative of the concentration of vacancy chains) after the irradiation and annealing treatment.

TABLE 8

Figure 2:
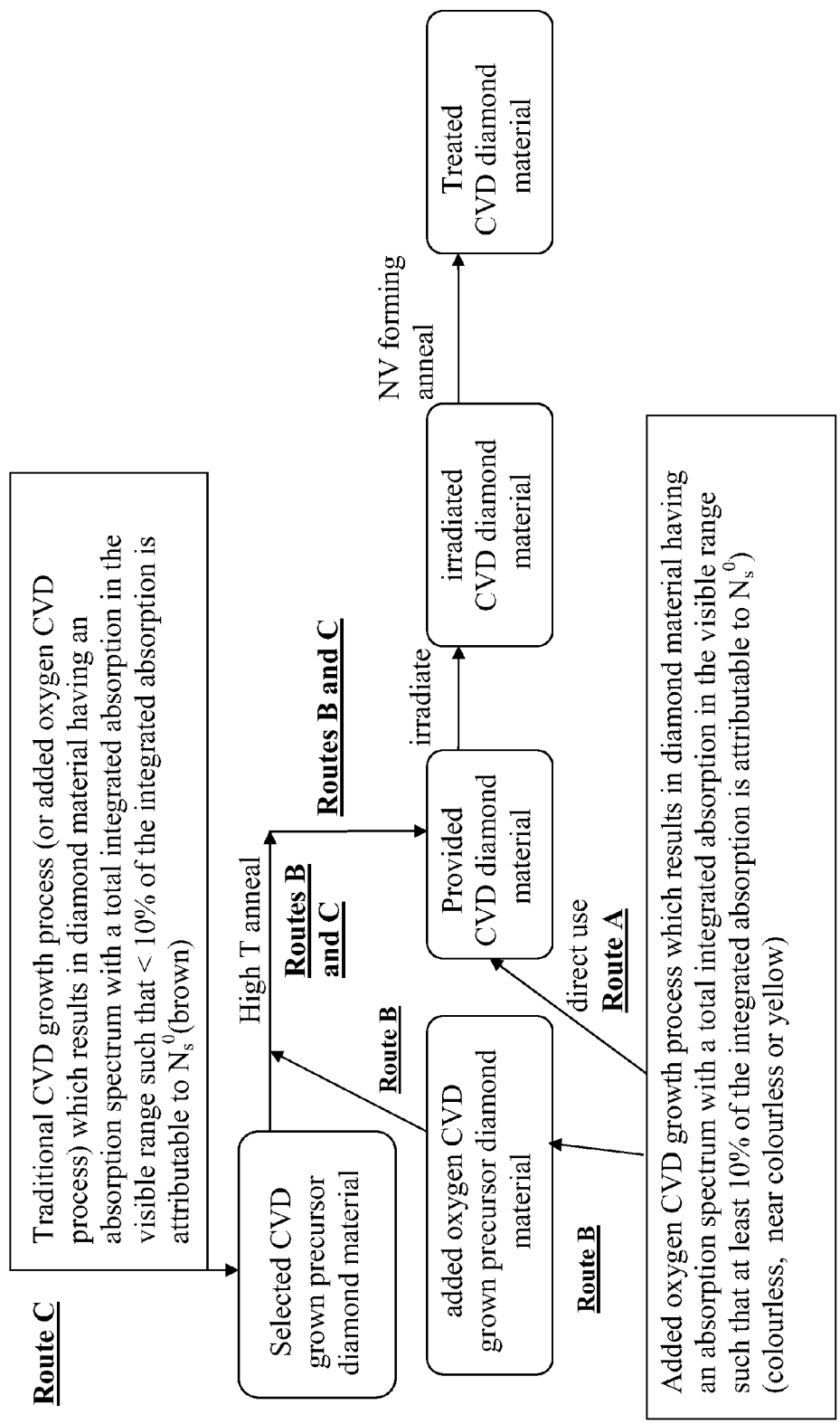

| Sample Number | Route to provided CVD diamond material (see FIG. 2) n/a for comparative examples | $N_s^0$ conc. In provided CVD diamond (ppm) | Percentage of integrated absorption in visible spectrum of provided CVD diamond, attributable to $N_s^0$ defects | RT UV/Vis absorption characteristics in provided CVD diamond (cm-1) | Irradiation dose (e/cm²) | Vacancy concentration post irradiation (ppm) | NV forming anneal time and temperature (hours) (° C.) |
|---|---|---|---|---|---|---|---|
| 1* | N/A | 0.1 | 5.8 | 270 nm = 1.16<br>350 nm = 0.78<br>510 nm = 0.30 | $2.6 \times 10^{17}$ | $V^0 = 0.17$<br>$V^- = 0.033$ | 8 hrs at 800° C. |
| 2* | N/A | 0.4 | 8.4 | 270 nm = 2.23<br>350 nm = 1.09<br>510 nm = 0.45 | $2.6 \times 10^{17}$ | $V^0 = 0.25$<br>$V^- = 0.12$ | 8 hrs at 800° C. |
| 3* | N/A | 0.35 | 28.4 | 270 nm = 1.42<br>350 nm = 0.63<br>510 nm = 0.23 | $2 \times 10^{16}$ | $V^0 = 0.0097$<br>$V^- = 0.009$ | 8 hrs at 800° C. |
| 4* | N/A | 0.35 | 28.4 | 270 nm = 1.42<br>350 nm = 0.63<br>510 nm = 0.23 | $2 \times 10^{18}$ | $V^0 = 1.1$<br>$V^- = 0.3$ | 1 hr at 800° C. |
| 5 | Route A | 0.35 | 28.4 | 270 nm = 1.42<br>350 nm = 0.63<br>510 nm = 0.23 | $2.6 \times 10^{17}$ | $V^0 = 0.06$<br>$V^- = 0.12$ | 8 hrs at 800° C. |
| 6* | N/A | 0.35 | 28.4 | 270 nm = 1.42<br>350 nm = 0.63<br>510 nm = 0.23 | $2 \times 10^{18}$ | $V^0 = 1.1$<br>$V^- = 0.3$ | 8 hrs at 800° C. |

TABLE 8-continued

| Sample Number | | | | | | |
|---|---|---|---|---|---|---|
| 7 | Route C | 0.33 | 30 | 270 nm = 1.05<br>350 nm = 0.26<br>510 nm = 0.12 | $2.6 \times 10^{17}$ | $V^0 = 0.05$<br>$V^- = 0.11$ | 8 hrs at 800° C. |

| Sample Number | Observed color of diamond after irradiation and annealing | Color characteristics $L^*, C^*, \alpha$ | NV concentration (ppm) Post irradiation and anneal | $V^0$ and $V^-$ concentration (ppm) | $N_s^0$ remaining in material post treatment (ppm) |
|---|---|---|---|---|---|
| 1* | Dull pinkish-brown | $L^* = 80.2$<br>$C^* = 5.05$<br>$\alpha = 67.7$ | $NV^0 = 0.031$<br>$NV^- = 0.0086$ | $V^0 = 0.046$<br>$V^- = 0.0099$ | 0.03 |
| 2* | Dull pinkish-brown | $L^* = 61.7$<br>$C^* = 12.72$<br>$\alpha = 57.8$ | $NV^0 = 0.078$<br>$NV^- = 0.038$ | $V^0 = 0.041$<br>$V^- = 0.0098$ | 0.3 |
| 3* | Colorless | $L^* = 78.1$<br>$C^* = 4.79$<br>$\alpha = 68.7$ | $NV^0 = 0.012$<br>$NV^- = 0.015$ | $V^0 = 0.0097$<br>$V^- = 0.009$ | 0.3 |
| 4* | Grey | $L^* = 69.3$<br>$C^* = 10.8$<br>$\alpha = 83.8$ | $NV^0 = 0.055$<br>$NV^- = 0.019$ | $V^0 = 0.45$<br>$V^- = 0.053$ | 0.3 |
| 5 | Pale pink | $L^* = 87.4$<br>$C^* = 4.26$<br>$\alpha = 44.93$ | $NV^0 = 0.061$<br>$NV^- = 0.0057$ | $V^0 = 0.068$<br>$V^- = 0.027$ | 0.25 |
| 6* | Orange pink | $L^* = 70.5$<br>$C^* = 17.08$<br>$\alpha = 71.7$ | $NV^0 = 0.092$<br>$NV^- = 0.019$ | $V^0 = 0.21$<br>$V^- = 0.034$ | 0.25 |
| 7 | Pale pink | RBC graded as pale pink | $NV^0 = 0.023$<br>$NV^- = 0.008$ | $V^0 = 0.033$<br>$V^- = 0.007$ | 0.27 |

*means comparative test sample

Figure 5:
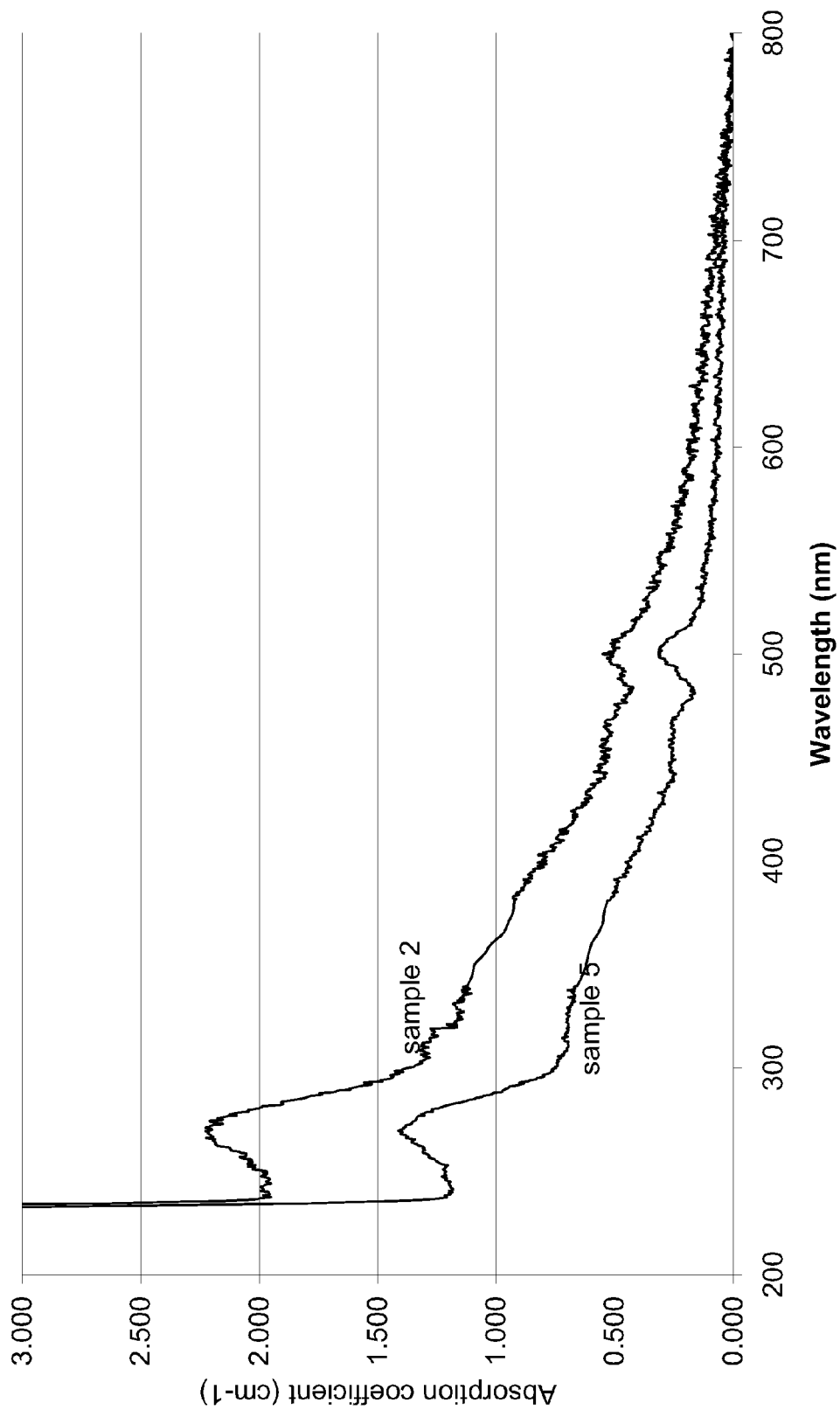
FIG. 5 shows the absorption spectrum for the provided CVD diamonds of one comparative sample of diamond material, and one provided CVD diamond material according to the invention.

FIG. 5 shows the absorption spectrum for the provided CVD diamonds of sample 2 (a comparative example) and of sample 5. Table 9 sets out the absorption coefficients at 270 nm (attributable to $N_s^0$) and at 350 nm and 510 nm (attributable to part of the X defects and thought to be responsible for the brown coloration, as described earlier). The calculated concentration in ppm of $N_s^0$ defects and the percentage contribution to the total integrated absorption in the visible range, calculated as described earlier, is also included for completeness, duplicating some of the information from Table 8.

TABLE 9

| Sample Number | 270 nm absorption coefficient (cm$^{-1}$) | 350 nm absorption coefficient (cm$^{-1}$) | 510 nm absorption coefficient (cm$^{-1}$) | $[N_s^0]$ (ppm) | $[N_s^0]$:X (%) |
|---|---|---|---|---|---|
| 2 | 2.25 | 1.09 | 0.45 | 0.4 | 8.4 |
| 5 | 1.42 | 0.63 | 0.23 | 0.35 | 28.4 |

From FIG. 5 and the data in tables 8 and 9, it can be seen that for sample 2 (comparative) where 0.4 ppm $N_s^0$ is present, and which has been made using a conventional CVD process, integrating the spectrum in the manner described earlier, the $N_s^0$ contribution to the visible part of the spectrum of sample 2 is found to be 8.4%, and hence outside the scope of the present invention which requires the provided CVD diamond to have a $N_s^0$ contribution to the total absorption in the visible range to be at least 10%.

In contrast, sample 5 has a similarly suitable high concentration of $N_s^0$ but reduced absorption associated with X defects. These figures give an $N_s^0$ contribution to the visible part of the spectrum for the provided diamond of sample 5 of 28.4%, i.e. within the scope of the claims of the present invention, being greater than 10%.

Figure 6A:
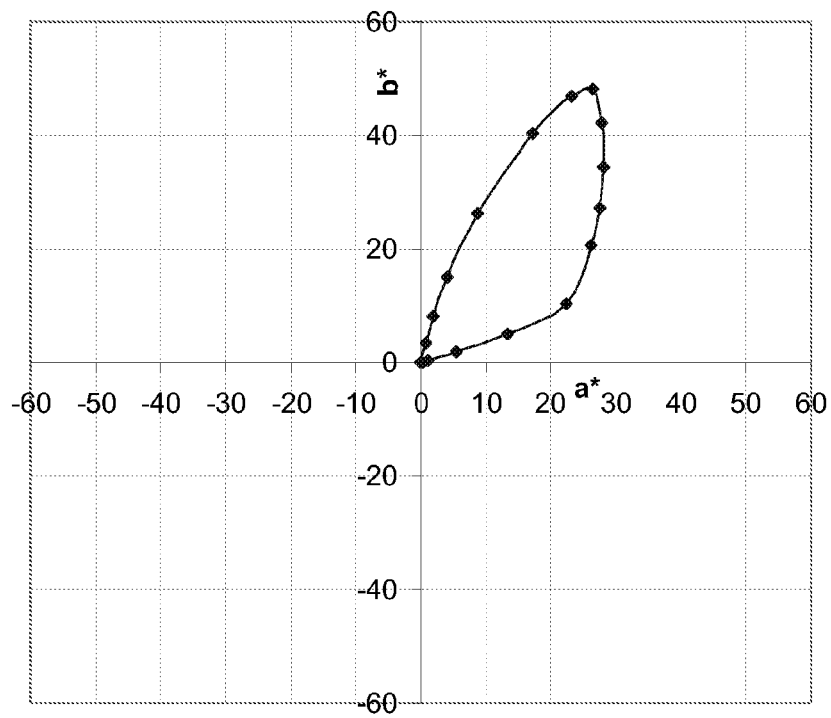
FIGS. 6a-6d show color model plots for the samples of FIG. 5 after irradiation and NV-forming annealing treatments.
Figure 6B:
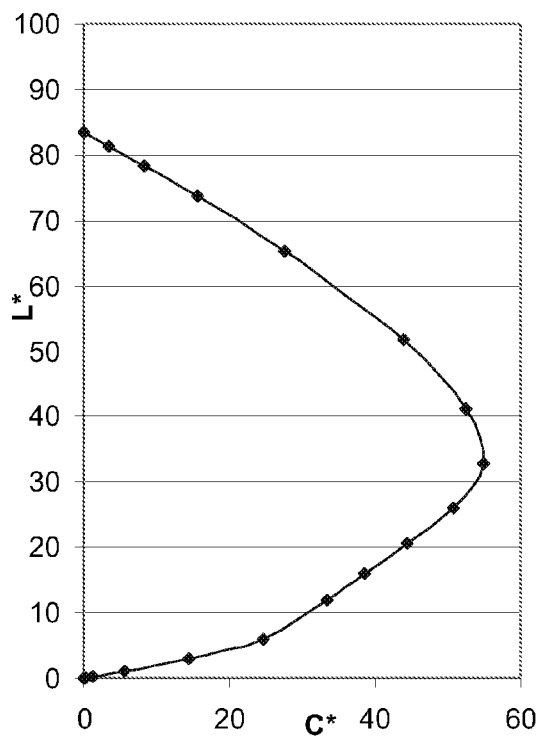
Figure 6C:
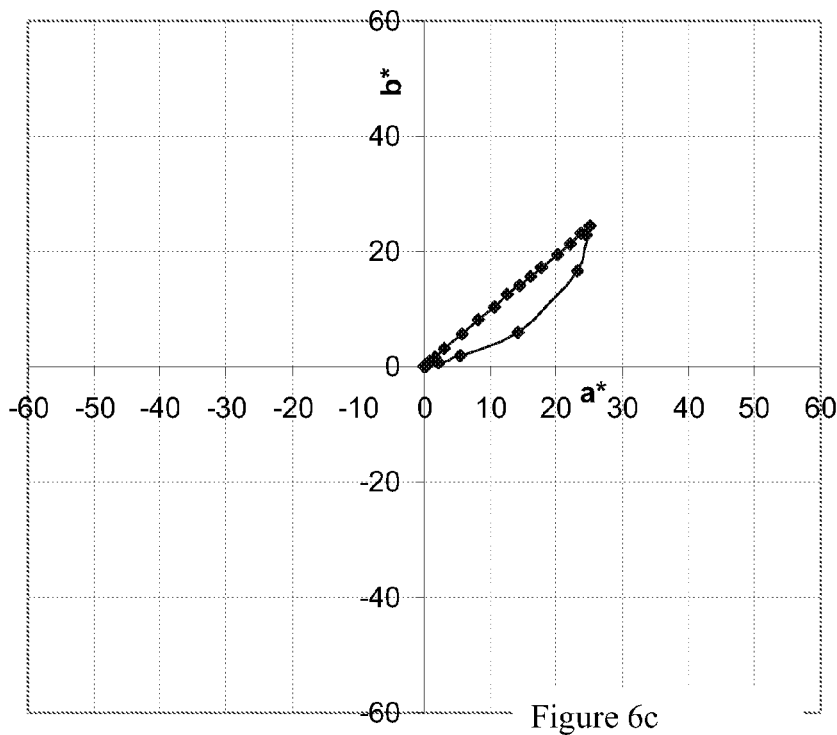
Figure 6D:
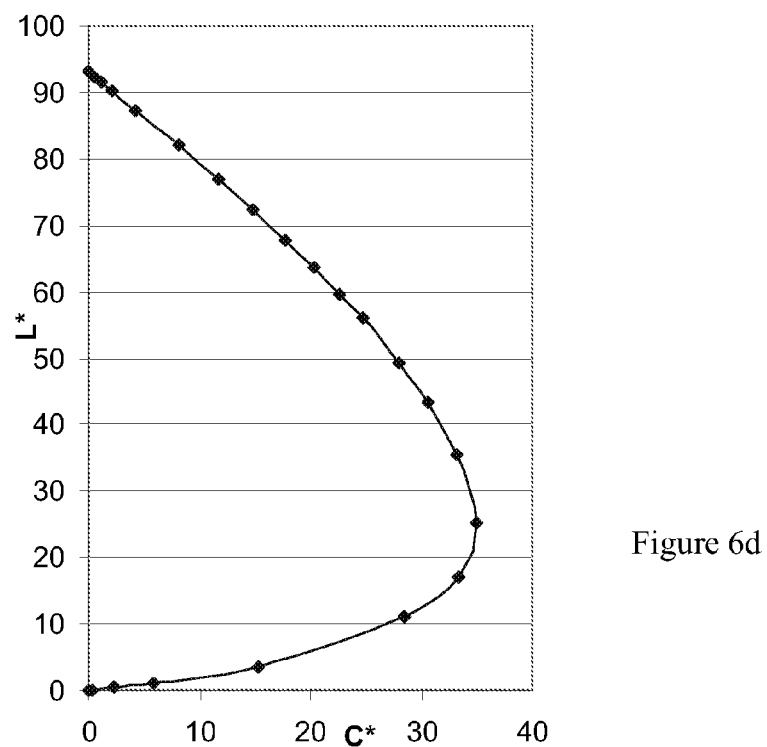

FIGS. 6a-6d show color model plots for comparative sample 2 and sample 5 after their irradiation and annealing treatments; FIG. 6a is an a*b* plot for sample 2, FIG. 6b is a L*C* plot for sample 2, FIG. 6c is an a*b* plot for sample 5, and FIG. 6b is a L*C* plot for sample 5.

Table 10 sets out the values of the color model parameters for these samples.

TABLE 10

| Color model parameter | Sample 2 - dull pinkish-brown (comparative) | Sample 5 - pale pink |
|---|---|---|
| L* | 61.7 | 87.4 |
| a* | 6.76 | 3.02 |
| b* | 10.78 | 3.01 |
| C* | 12.72 | 4.26 |
| Hue angle, ° | 57.8 | 44.93 |

From FIGS. 6a-6d and Table 10 we can see that sample 5 has a higher L* value (increased lightness), i.e. within the scope of the claims of the present invention, being >70, whereas samples 2 does not.

As can be seen, samples 5 and 7 achieve a pale pink color, which in the gem trade is considered more desirable than the dull pink color for samples 1 and 2. From these results it is deduced that, at least for ornamental applications, the percentage integrated absorption in the visible spectrum of the provided CVD diamond attributable to $N_s^0$ defects should be at least 10%, optionally at least 12%, and for some embodiments at least 15%.

Figure 7:
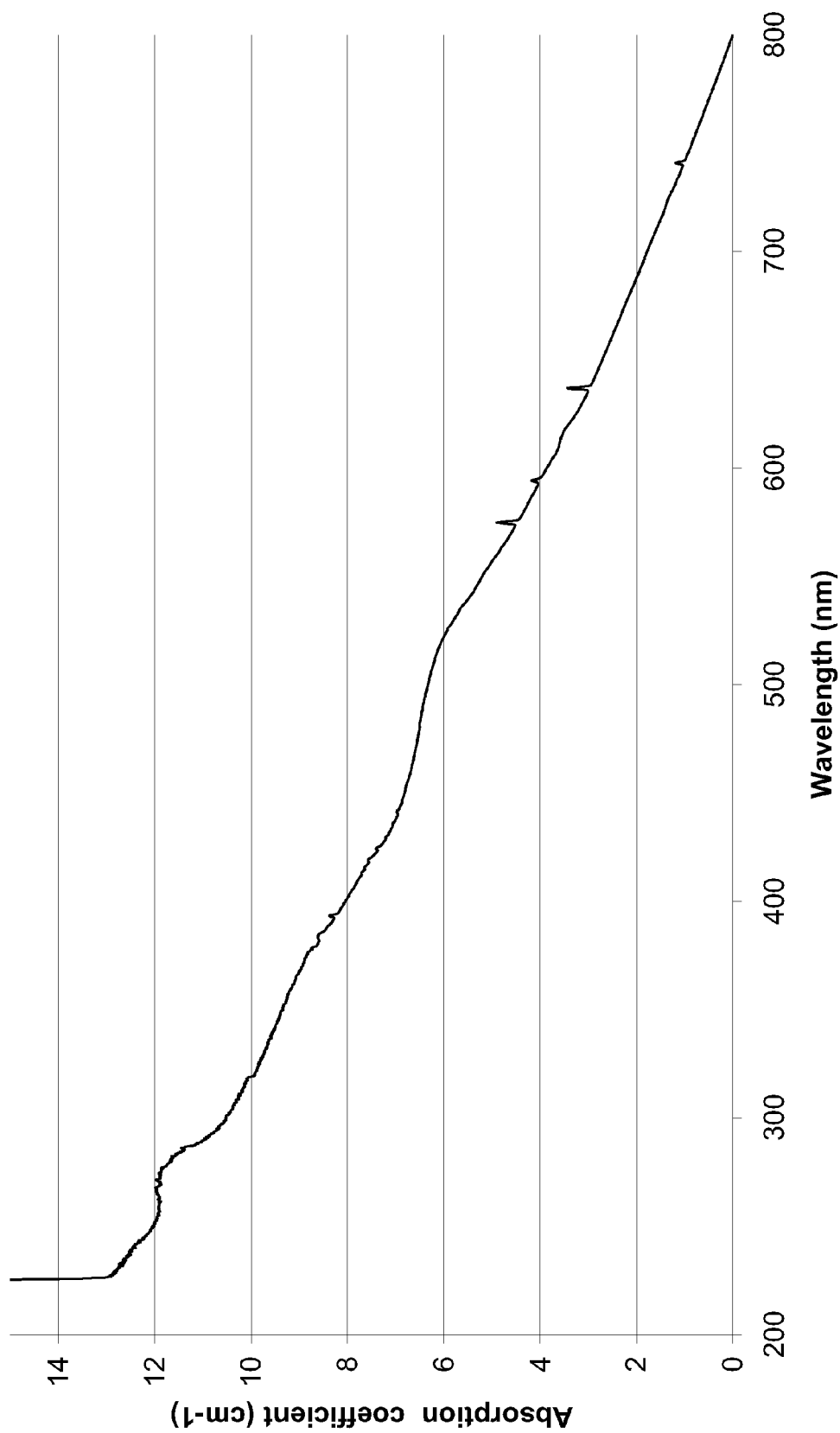
FIG. 7 shows the absorption spectrum for the provided CVD diamond material sample according to the invention of FIG. 5 after the irradiation and NV-forming annealing treatment.

FIG. 7 shows the absorption spectrum for sample 5 after irradiation and annealing treatment and Table 11 shows the calculated concentrations of various defects in the sample in ppm.

TABLE 11

| Defect | Concentration in ppm |
|---|---|
| [NV⁰] | 0.061 ppm |
| [NV⁻] | 0.0057 ppm |
| [NV] total | 0.0667 ppm |
| [V⁰] (GR1) | 0.068 ppm |
| [V⁻] (ND1) | 0.027 ppm |
| [V] total | 0.095 ppm |
| Absorption at 250 nm (indicative of vacancy chains) | 12 cm$^{-1}$ |

From FIG. 7 and table 11 it can be seen that GR1 and ND1 peaks (indicative of excess isolated vacancies V⁰ and V⁻ respectively are less than 0.3 cm$^{-1}$ and 0.3 cm$^{-1}$ respectively, indicating a total concentration of isolated vacancies (V⁰+V⁻ combined) of 0.095 ppm and the absorption at 250 nm is <20 cm$^{-1}$.

From this spectrum the NV concentration formed was also found to be >0.03 ppm.

Table 8 includes a number of comparative examples which fall outside the scope of the present invention for the following reasons. Considering for example the method claims, samples 1 and 2 have integrated absorption in the visible spectrum of the provided CVD diamond attributable to $N_s^0$ of <10%. Irradiation and NV-forming annealing steps result in treated diamond material with hue angles that fall outside the range 0°-60° for sample 1, and L* values that fall outside that range for sample 2. Sample 3 is under-irradiated, it falls outside the main method claim as <0.05 ppm of isolated vacancies were introduced, and the treated material has an [NV⁰+NV⁻]: [$N_s^0$] concentration less than the concentration of <0.16 ppm and a hue angle which falls outside the range 0°-60°. The over-irradiated diamond, sample 4, which was annealed for a short duration to minimize the formation of vacancy chains falls outside the main method claim as the irradiation dose introduced >1 ppm of isolated vacancies, the treated diamond post anneal has a L* value less than values stated for some embodiments according to the invention, a C* value greater than the values stated for some embodiments according to the invention, and a hue angle outside the range of 0°-60°. Sample 6 which was over irradiated and annealed for a long duration also falls outside the main method claim as the irradiation dose introduced >1 ppm of isolated vacancies. It has a hue angle outside of the range of 0°-60° and the absorption at 250 nm associated with vacancy chains is >20 cm$^{-1}$. A similar analysis can be applied for the comparative examples with respect to the article claims.

Calculating the optimum concentration of isolated vacancies to introduce into a sample within the range described in the claims is advantageous where it is desired to produce the optimum pale pink colored diamond material and/or the ideal material for spintronic applications. A method that can be used to calculate this is to take the approximately 6 samples of the provided diamond and irradiate them all for significantly longer than ideal, so as to introduce >1 ppm of isolated vacancies into the material. Each piece of the irradiated diamond material can then be annealed at 800° C. for an increasing duration. The concentrations of V⁰, V⁻, NV⁰ and NV⁻ can then be measured using the method described earlier. An optimum concentration of isolated vacancies (V⁰+V⁻) to introduce (the target vacancy concentration) is the concentration consumed to reach the point where the concentration of NV centers (NV⁰+NV⁻) is substantially constant (by which we mean it shows less than a 10% change). Table 12 sets out the measured results achieved for one example for different anneal times.

TABLE 12

| Anneal at 800° C. | [V⁰] | [V⁻] | Total [V] | [NV⁰] | [NV⁻] | Total [NV] |
|---|---|---|---|---|---|---|
| No anneal | 0.5 | 0.05 | 0.55 | 0 | 0 | 0 |
| Ramp to 800° C. only - no dwell | 0.32 | 0.035 | 0.35 | 0.011 | 0 | 0.011 |
| 1 hr dwell | 0.22 | 0.032 | 0.25 | 0.017 | 0.0028 | 0.019 |
| 2 hrs dwell | 0.13 | 0.011 | 0.14 | 0.034 | 0.0044 | 0.038 |
| 4 hrs dwell | 0.09 | 0.0098 | 0.099 | 0.027 | 0.0033 | 0.030 |
| 8 hrs dwell | 0.02 | 0 | 0.02 | 0.03 | 0.0023 | 0.032 |

Figure 3:
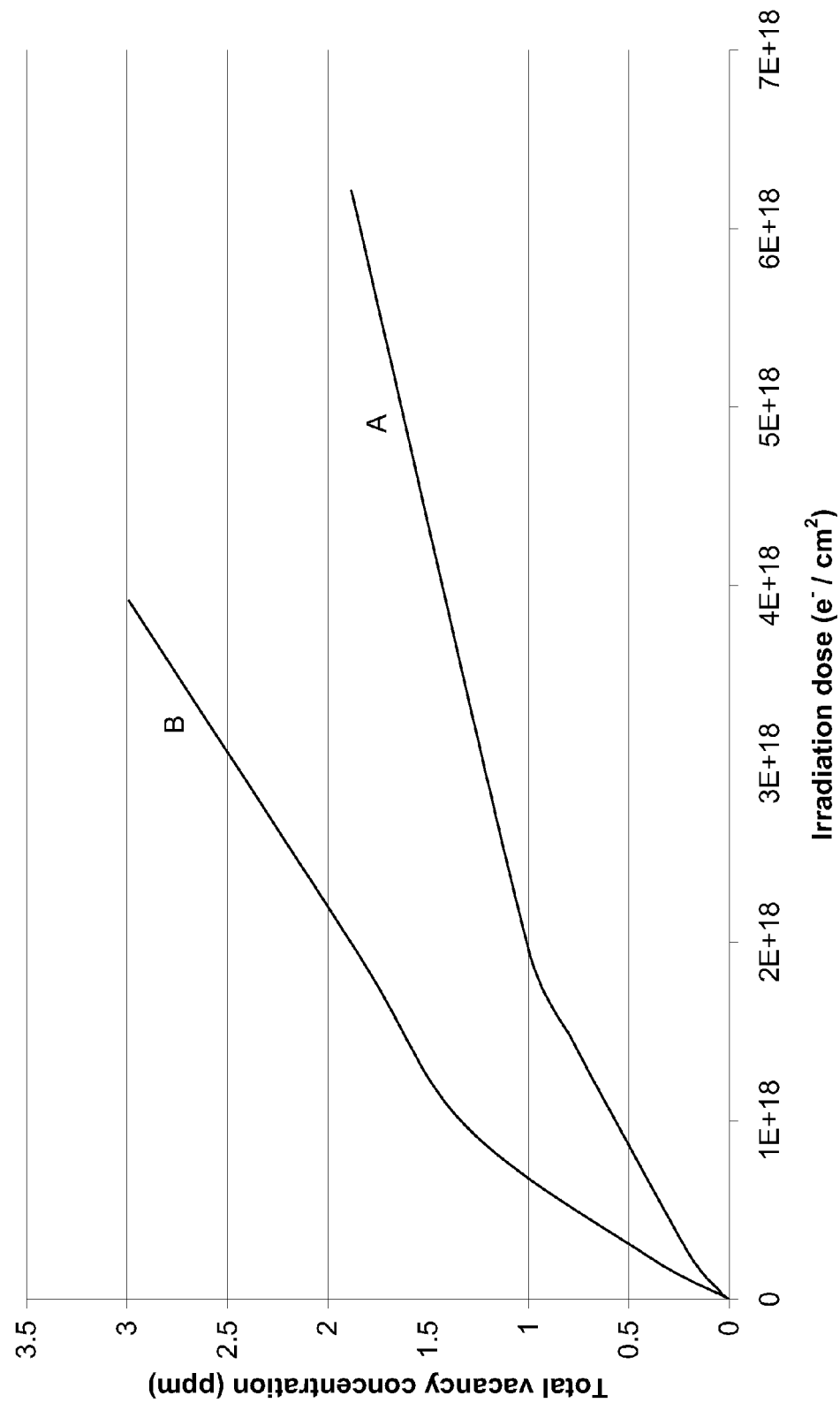
FIG. 3 is a graph that shows the increase in isolated vacancy concentration introduced into CVD diamond material by increasing the irradiation dose.
Figure 4:
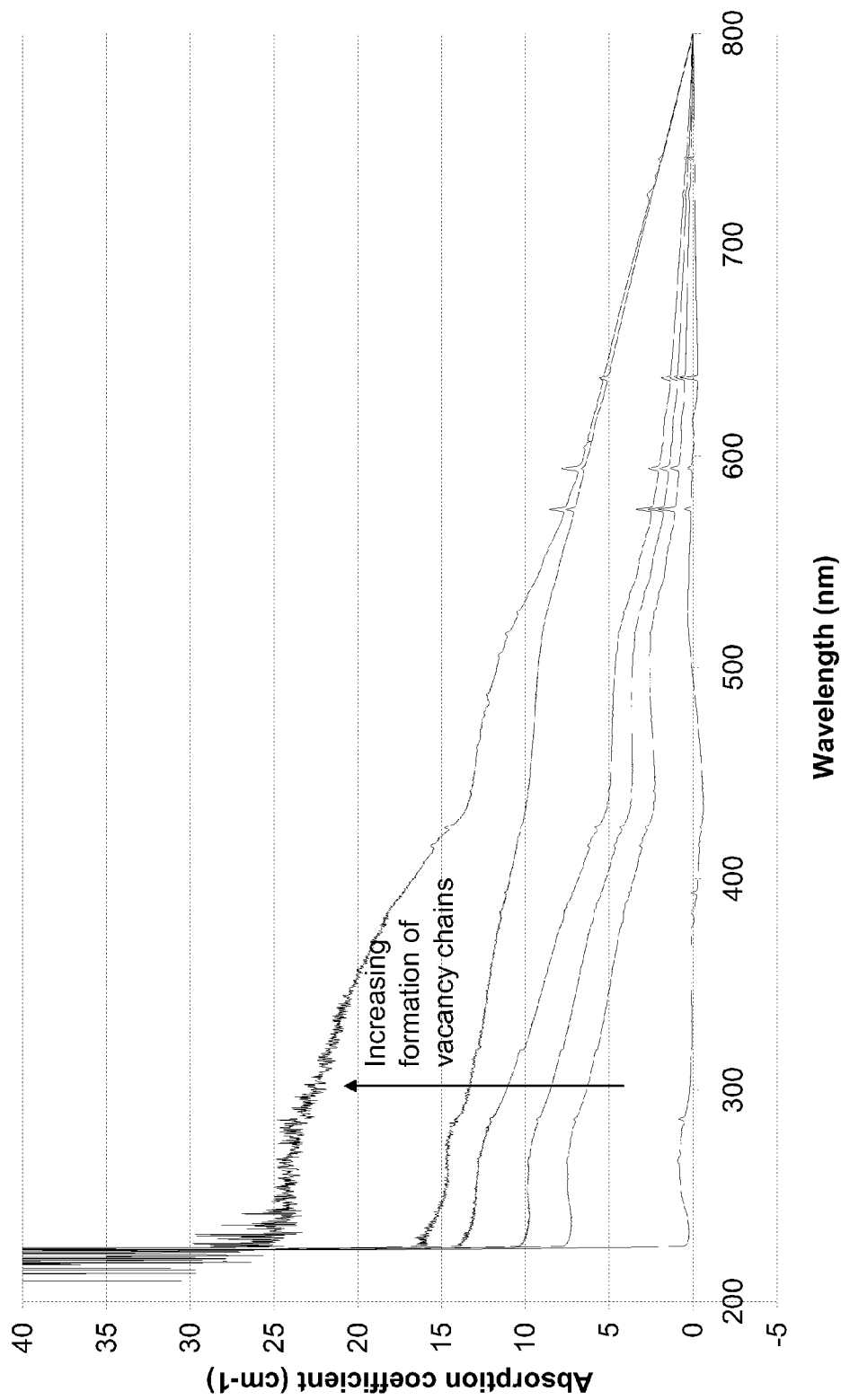
FIG. 4 is a series of absorption spectra which show the increase in absorption with increasing formation of vacancy chains.

For this example the [NV] is effectively constant after 2 hrs dwell at 800° C., at which point 0.41 ppm of isolated vacancies have been consumed therefore this would have been the ideal concentration to introduce. If we introduce less than this the maximum concentration of NV centers will not be achieved, if we introduce more than this the remaining isolated vacancies will either remain as isolated vacancies if a short anneal is applied or be converted to vacancy chains if a longer anneal is applied, both of which are detrimental to the final diamond material properties. The irradiation dose required to introduce the calculated concentration of isolated vacancies will be specific to the diamond material used. For this example the curve of vacancy concentration with irradiation dose is shown as FIG. 3 (diamond material A). For this example introducing 0.4 ppm of isolated vacancies would require an irradiation dose of 6×10$^{17}$ e⁻/cm².

The invention claimed is:

1. A method of introducing NV centers into CVD diamond material, the method comprising:
   (i) irradiating single crystal diamond material that has been grown by CVD, contains single substitutional nitrogen ($N_s^{0}$) and has an absorption spectrum with a total integrated absorption in the visible range from 350 nm to 750 nm such that at least 10% of the integrated absorption is attributable to $N_s^0$, to introduce isolated vacancies V into at least part of the CVD diamond material, the concentration of isolated vacancies in the irradiated diamond material being at least 0.05 ppm and at most 1 ppm; and
   (ii) annealing the irradiated diamond material to form NV centers from at least some of the single substitutional nitrogen ($N_s^0$) defects and the introduced isolated vacancies;

wherein after the irradiation and annealing steps (i) and (ii) the treated CVD diamond material has the following characteristics:

| [V⁰] GR1 | <0.3 ppm |
|---|---|
| [V] ND1 | <0.3 ppm |
| [$N_s^0$] | <1.5 ppm |
| [V chains] | <20 cm$^{-1}$ at 250 nm |
| [NV] | ≥10$^{-12}$ cm$^{-3}$. |

2. A method according to claim 1, wherein the step of irradiating the CVD diamond material introduces into the material a total isolated vacancy concentration [$V_T$] in parts per million which is greater than 0.1×[$N_s^0$] concentration in ppm in the CVD diamond material, and is less than 0.9×[$N_s^0$] concentration in ppm in the CVD diamond material.

3. A method according to claim 1, comprising providing a substrate and a source gas; and allowing homoepitaxial diamond synthesis on the substrate to wherein the synthesis environment comprises nitrogen at an atomic concentration of from about 0.4 ppm to about 50 ppm; and wherein the source gas comprises: (a) an atomic fraction of hydrogen $H_f$, from about 0.4 to about 0.75; (b) an atomic fraction of carbon, $C_f$, from about 0.15 to about 0.3; (c) an atomic fraction of oxygen, $O_f$, from about 0.13 to about 0.4; wherein $H_f+C_f+O_f=1$; wherein the ratio of atomic fraction of carbon to the atomic fraction of oxygen $C_f:O_f$ satisfies the ratio of about 0.45:1<$C_f:O_f$<about 1.25:1; wherein the source gas comprises hydrogen atoms added as hydrogen molecules, $H_2$, at an atomic fraction of the total number of hydrogen, oxygen and carbon atoms present of between 0.05 and 0.4; and wherein the atomic fractions $H_f$, $C_f$ and $O_f$ are fractions of the total number of hydrogen, oxygen and carbon atoms present in the source gas, the diamond synthesis process producing the said CVD diamond material that is irradiated and annealed according to claim 1, or providing an added-oxygen-CVD-grown-precursor-diamond-material that can be treated to produce the CVD diamond material that is irradiated and annealed according to claim 1.

4. A method according to claim 3, wherein the diamond synthesis process produces a precursor-diamond-material, and the method comprises treating the precursor diamond material by annealing the grown CVD diamond material at a temperature of at least 1600° C. to produce the said CVD diamond material that is irradiated and annealed according to claim 1.

5. A method according to claim 1, comprising providing a traditional-CVD-grown-precursor-diamond-material comprising single substitutional nitrogen ($N_s^0$) and having an absorption spectrum with a total integrated absorption in the visible range from 350 nm to 750 nm such that less than 10% of the integrated absorption is attributable to $N_s^0$, and then annealing the grown CVD diamond material at a temperature of at least 1600° C. to produce the said CVD diamond material that is irradiated and annealed according to the method of claim 1.

6. A method according to claim 1, wherein the CVD diamond material prior to the irradiation has the following absorption characteristics measured at room temperature:

| Designation | Starts (nm) | Ends (nm) | Peak (nm) | Absorption coefficient at peak ($cm^{-1}$) |
|---|---|---|---|---|
| 270 nm $N_s^0$ | 220 | 325 | 270 | <4 |
| 350 nm band Part of "X" | 270 | 450 | 350 ± 10 | <0.7 |
| 510 nm band Part of "X" | 420 | 640 | 510 ± 50 | <0.3. |

7. A method according to claim 1, wherein the irradiated and annealed CVD diamond material has a room temperature measured T2 that is greater than 100 µs.

8. A method according to claim 1, wherein after the irradiation and annealing steps (i) and (ii) the treated CVD diamond material has a color such that if in the form of a 0.5 ct RBC it would be graded fancy pale pink.

9. A method according to claim 1, wherein after the irradiation and annealing steps (i) and (ii) the treated CVD diamond material has the following color characteristics measured for an equivalent 0.5 ct RBC:

| Characteristic | Range |
|---|---|
| Hue angle α | 0°-60° |
| C* | 3.0-20 |
| L* | >65. |

10. A method according to claim 9, wherein after the irradiation and annealing steps (i) and (ii) the ratio ($[NV^-]+[NV^0]$)/$[N_s^0]$ in the treated CVD diamond material is greater than 0.16.

11. A treated CVD synthetic single crystal diamond material which, when in the form of a 0.5 ct RBC, is graded fancy pale pink, the single crystal CVD synthetic diamond material having the following characteristics:

| | |
|---|---|
| $[V^0]$ GR1 | <0.3 ppm |
| $[V^-]$ ND1 | <0.3 ppm |
| $[N_s^0]$ | <0.5 ppm |
| [NV] | ≥$10^{12}$ $cm^{-3}$. |

12. A treated CVD synthetic single crystal diamond material according to claim 11, having the following color characteristics:

| Characteristic | Range |
|---|---|
| Hue angle α | 0°-60° |
| C* | 3.0-20 |
| L* | >70. |

13. A treated CVD synthetic single crystal diamond material according to claim 11, having the following characteristics:

| | |
|---|---|
| $[V^0]$ GR1 | <0.3 ppm |
| $[V^-]$ ND1 | <0.3 ppm |
| $[N_s^0]$ | <0.5 ppm |
| [V chains] peak concentration | <20 $cm^{-1}$ at 250 nm. |

14. A treated CVD synthetic single crystal diamond according to claim 11, wherein the ratio ($[NV^-]+[NV^0]$)/$[N_s^0]$ is greater than 0.16.

15. A treated CVD synthetic single crystal diamond material according to claim 11 which is a gemstone.

16. A treated CVD synthetic single crystal diamond material having the following characteristics:

| | |
|---|---|
| $[V^0]$ GR1 | <0.3 ppm |
| $[V^-]$ ND1 | <0.3 ppm |
| $[N_s^0]$ | <0.5 ppm |
| [NV] | ≥$10^{12}$ $cm^{-3}$. |

17. A treated CVD synthetic single crystal diamond according to claim 16 having a $V_{chain}$ absorption at 250 nm that is less than 20 $cm^{-1}$.

18. A treated CVD synthetic single crystal diamond according to claim 16, having a T2 value that is greater than 100 µs.

19. A treated CVD synthetic single crystal diamond according to claim 16, wherein the ratio ($[NV^-]+[NV^0]$)/$[N_s^0]$ is greater than 0.16.

20. A treated CVD synthetic single crystal diamond material according to claim 16, which is a spintronic device.

* * * * *